United States Patent
Nicolaidis et al.

(10) Patent No.: US 7,990,759 B2
(45) Date of Patent: Aug. 2, 2011

(54) HARDENED MEMORY CELL

(75) Inventors: Michel Nicolaidis, Grenoble (FR); Renaud Perez, Grenoble (FR)

(73) Assignee: IROC Technologies, Grenoble (FR)

( * ) Notice: Subject to any disclaimer, the term of this patent is extended or adjusted under 35 U.S.C. 154(b) by 885 days.

(21) Appl. No.: 11/988,049

(22) PCT Filed: Jul. 5, 2006

(86) PCT No.: PCT/FR2006/001590
§ 371 (c)(1), (2), (4) Date: Dec. 28, 2007

(87) PCT Pub. No.: WO2007/006909
PCT Pub. Date: Jan. 18, 2007

(65) Prior Publication Data
US 2008/0253180 A1    Oct. 16, 2008

(30) Foreign Application Priority Data
Jul. 5, 2005 (FR) .................... 05 07147

(51) Int. Cl.
*G11C 11/00* (2006.01)

(52) U.S. Cl. ........ 365/156; 365/129; 365/154; 365/244; 257/288; 438/284

(58) Field of Classification Search .................. 365/129, 365/154, 156, 189.08, 244; 257/288; 438/284
See application file for complete search history.

(56) References Cited

U.S. PATENT DOCUMENTS

| | | |
|---|---|---|
| 5,525,923 A | 6/1996 | Bialas, Jr. et al. |
| 5,631,863 A | 5/1997 | Fechner et al. |
| 2004/0124876 A1* | 7/2004 | Plants ............. 326/39 |
| 2004/0165417 A1 | 8/2004 | Lesea |
| 2007/0103966 A1* | 5/2007 | Plants ............. 365/154 |

FOREIGN PATENT DOCUMENTS
WO    WO 01/10026 A1    2/2001

* cited by examiner

*Primary Examiner* — Richard Elms
*Assistant Examiner* — Harry W Byrne
(74) *Attorney, Agent, or Firm* — Oliff & Berridge, PLC

(57) ABSTRACT

The memory cell comprises first and second inverter circuits, connected in a loop. First and second decoupling transistors, normally turned off outside the write phases, are respectively connected between an output of the second inverter circuit and first and second inputs of the first inverter circuit. The memory cell is thereby protected against transient disturbances due to ionizing particles. The gates of the decoupling transistors are preferably respectively connected to a supply voltage for the P-type decoupling transistors and grounded for the N-type decoupling transistors.

28 Claims, 18 Drawing Sheets

HARDENED MEMORY CELL

BACKGROUND OF THE INVENTION

The invention relates to a memory cell protected against transient disturbances.

STATE OF THE ART

As represented in FIG. 1, a memory cell conventionally comprises two loop-connected inverters. Thus, a first inverter 1 comprising an input A and an output B, a second inverter 2 is connected in a feedback loop. Its input is then connected to output B of the first inverter, whereas its output is connected to input A of first inverter 1. The information is stored in the two nodes (A and B) which connect the output of one inverter with the input of the other. The state of the output of an inverter is however determined by the state of its input. If this electric state is degraded because of leakage currents, the cell can lose the information it is supposed to store. This is not the case with a cell according to FIG. 1, for the output of each inverter is able to supply a current that is able to compensate the losses due to these leakage currents.

However, transient electric impulses induced by ionizing particles striking a memory cell node can propagate in the feedback loop of the cell and reverse its state.

To protect against this phenomenon, it has been proposed to connect resistors in the feedback loop of the cell so as to delay propagation of the impulse through the cell. An example of a cell of this type is illustrated in FIG. 2. A resistor R is connected in the feedback loop, between output B1 of first inverter 1 and input B2 of second inverter 2. It prevents any transient disturbance occurring on output B1 from propagating quickly to input A of first inverter 1.

Another example of a cell of this type is illustrated in FIG. 3. Each inverter is conventionally formed by a series circuit with a P-type transistor Tp (Tp1 for the first inverter; Tp2 for the second) and an N-type transistor Tn (Tn1; Tn2), connected in series to the terminals of a supply voltage Vdd. The point common to transistors Tp1 and Tn1 constitutes the output B1 of the first inverter. Output B1 is connected, via a first resistor R1, to the input B2 of the second inverter, i.e. to the gates of transistors Tp2 and Tn2. The point common to transistors Tp2 and Tn2 constitutes the output Q of the second inverter. The latter is connected, via a second resistor R2, to input A of the first inverter, i.e. to the gates of transistors Tp1 and Tn1.

In normal operation, when input B2 is at 1, transistor Tn2 is on and transistor Tp2 is off. Output Q and input A are then at 0, transistor Tp1 is on, whereas transistor Tn1 is off and B1 is also at 1. Ionizing particles can however cause a transient impulse on the drain of a transistor, in particular during a store phase (outside the write phases). The drain of transistors Tn1 or Tp2 can therefore transiently go respectively to 0 and to 1, respectively making B1 go to 0 or Q go to 1. In the opposite manner, in normal operation, if B2 is at 0, Tn2 is off, Tp2 is on, Q and A are at 1, Tp1 is off, Tn1 is on and B1 is at 0. A disturbance can then make the drain of transistors Tp1 or Tn2 go transiently respectively to 1 and to 0, respectively making B1 go to 1 or Q go to 0. In the absence of resistors R1 and R2, these disturbances on the output of an inverter are directly transmitted to the input of the other inverter. The presence of resistors R1 and R2 slows down their propagation and prevents the correct information from being lost in the memory cell during the store phases. The charge deposited on the node on which the impulse occurs is thus evacuated towards the power supply terminals, Vdd or ground, of the cell, before the impulse propagates through the feedback loop and inverts the state of the other node of the cell. However, the presence of resistor R1 between input A and output Q of the cell reduces the speed of the cell.

Resistors R1 and R2 can be formed by a passive component, for example made of high-resistivity polysilicon. This enables resistors of high value to be achieved using a small silicon surface. The major shortcoming of this technique is that it requires an additional step in the manufacturing process, which increases the cost thereof.

A cell of similar type, with resistors on the input of each of the inverters, is in particular mentioned in U.S. Pat. No. 5,525, 923. This document does however discard this solution, which has the drawback of increasing the write time for writing data in the cell. It proposes to connect an isolation resistor in series between transistor Tp and transistor Tn of each inverter to harden the cell. The cell comprises two feedback loops each comprising a transistor that is off in the write phase and on outside the write phases, which ensures ease of writing while holding the state of the cell outside the write phases. These feedback loops connect two distinct outputs (drains of Tp2 and Tn2) of the $2^{nd}$ inverter (Tp2, Tn2, isolation resistor) to two distinct inputs (gates of Tp1 and Tn1) of the $1^{st}$ inverter (Tp1, Tn1, isolation resistor).

The resistors can also be achieved by means of transistors. Thus, in the International Patent application WO 01/10026, the isolation resistors of U.S. Pat. No. 5,525,923 are replaced by isolation transistors permanently held in on state.

Similarly, resistor R of the hardened cell according to FIG. 2 can be achieved by means of a transistor. However, in this case, the drain of this transistor then forms a sensitive node that is liable to be the site of creation of disturbances induced by ionizing particles, able to propagate without any obstacle to input A and output B1 of first inverter 1, and inverting the state of the cell.

U.S. Pat. No. 5,631,863 and US Patent application 2004/ 165417 propose to overcome the drawbacks of cells hardened by resistors on input or on output of each inverter by replacing these resistors by decoupling transistors that are off outside the write phases but having sufficient leakage currents to hold the memory cell in the required state without requiring refreshing as in dynamic RAM memories. However, an impulse induced by an ionizing particle striking a decoupling transistor places the cell in a metastable state in which the inputs of the two inverters have the same value, which can mean that the correct value in the cell is lost.

Known hardened cells are therefore not optimal, in particular from the protection and/or speed and/or flexibility point of view.

OBJECT OF THE INVENTION

The object of the invention is to provide a memory cell, which does not present the shortcomings of known cells. The object is more particularly to provide a hardened memory cell having a low surface cost.

This object is achieved by a cell according to the appended claims.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
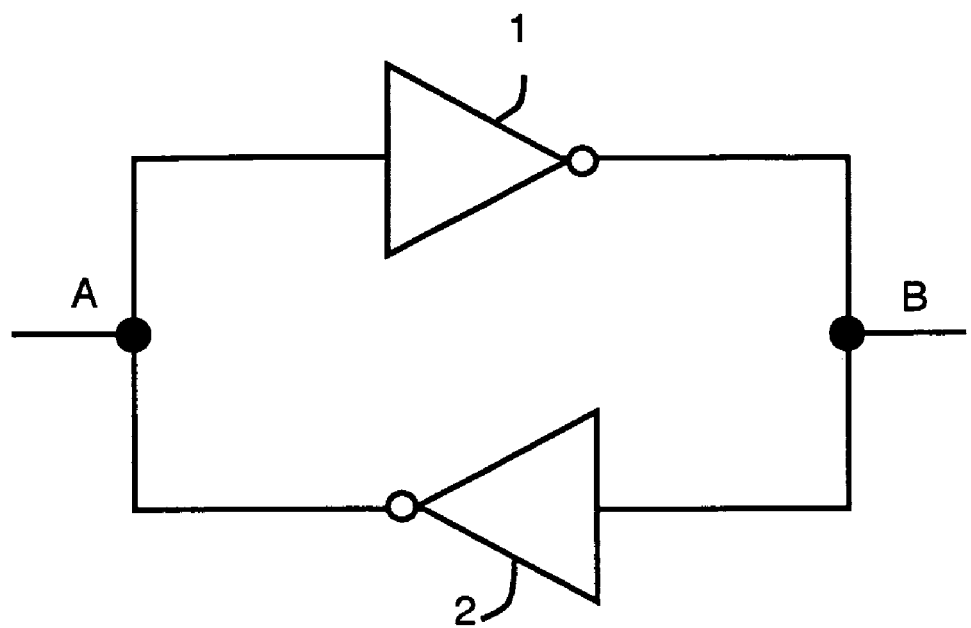
FIGS. 1 to 3 illustrate various embodiments of a memory cell according to the prior art.
Figure 2:
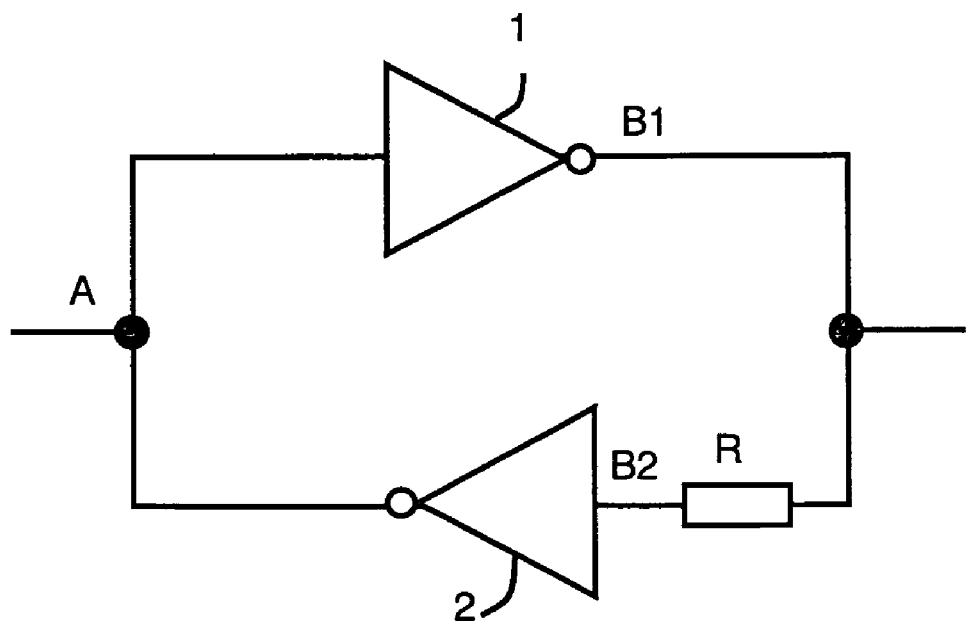
Figure 3:
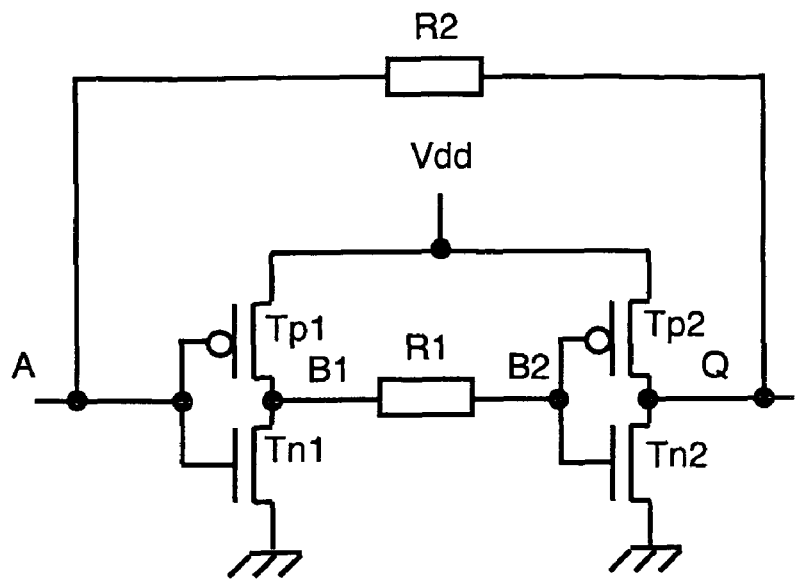
Figure 4:
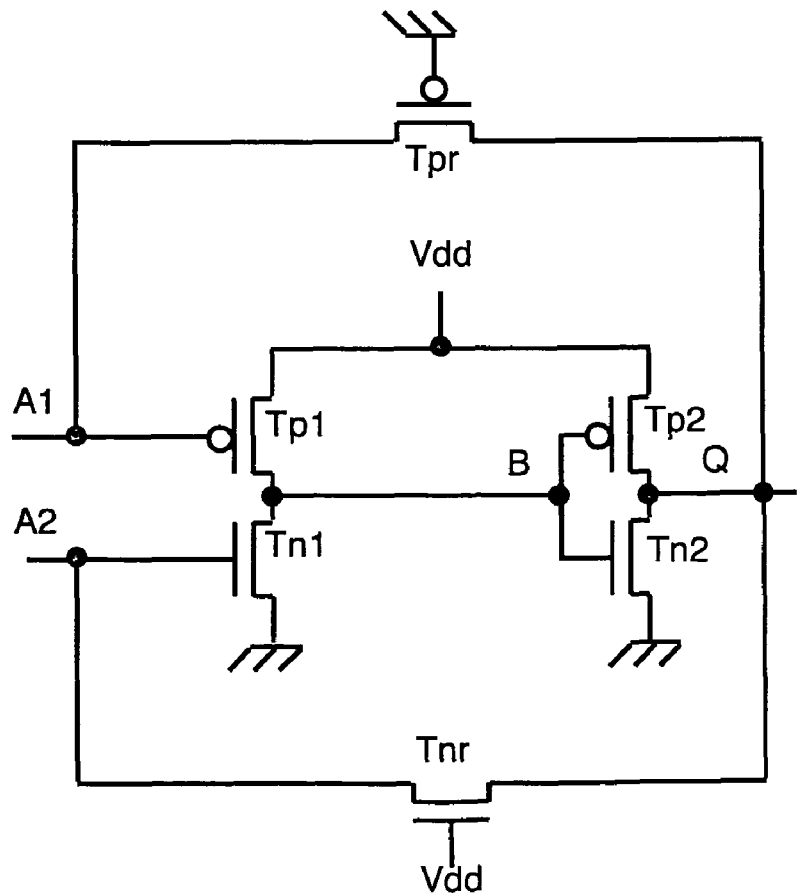
FIG. 4 illustrates a potential alternative to hardened cells according to the prior art.

In the alternative illustrated in FIG. 4, the first inverter comprises two inputs A1 and A2 to which identical signals are applied. First and second long transistors Tpr and Tnr, respectively P-type and N-type, are connected in two distinct feedback loops, respectively between the output Q of the second inverter and the gates of the transistors Tp1 and Tn1 respectively constituting the first and second inputs A1 and A2 of the first inverter. The gates of transistors Tnr and Tpr are respectively connected to the supply voltage Vdd and to ground and these two transistors are consequently always turned on. Propagation of a transient error from output Q to inputs A1 and A2 is delayed by the resistors formed by transistors Tpr and Tnr.

Direct connection of the output of the $1^{st}$ inverter (Tp1, Tn1) and of the input of the $2^{nd}$ inverter (Tp2, Tn2) prevents an additional delay from being introduced in the write phase. Moreover, this embodiment does not introduce any additional step in the manufacturing process. It does however require the use of transistors Tpr and Tnr of great length to achieve a sufficiently high resistance value to delay propagation of errors during the store phases (outside the write phases). It consequently results in a large increase of the surface of the cell. A length equal to 10 times the minimum length of a transistor in a given technology can for example be necessary to obtain satisfactory protection. This leads to a substantive increase of the cell surface, which makes it unacceptable in the large majority of applications.

Figure 5:
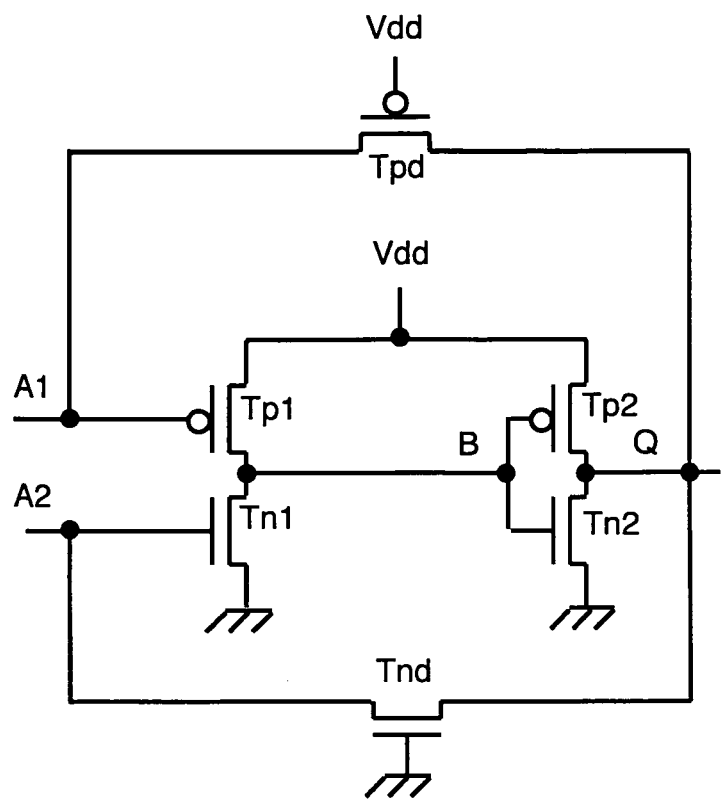
FIG. 5 represents a particular embodiment of a storage cell according to the invention.

The memory cell according to FIG. 5 differs from the cell according to FIG. 4 by the fact that transistors Tpr and Tnr are respectively replaced in the feedback loops by decoupling transistors Tpd and Tnd, respectively P-type and N-type. The gates of decoupling transistors Tnd and Tpd are therefore respectively grounded and connected to supply voltage Vdd. Decoupling transistors Tpd and Tnd are then permanently off and induce extremely high resistances in the two feedback loops of the cell. Consequently, in store phase (outside the write phases), inputs A1 and A2 are in a high-impedance state. In this state, their potential remains unchanged in the short term, but can be very slowly degraded by leakage currents. The leakage currents flowing through the channels of the transistors are nevertheless greater than the leakage currents flowing through the gate oxides of the transistors. The leakage currents flowing through the channels of decoupling transistors Tpd and Tnd are therefore greater than the leakage currents flowing through the gate oxides of transistors Tp1 and Tn1. Therefore, if the initial electric state of the nodes constituting inputs A1 and A2 of the first inverter is identical to the electric state of output Q of the second inverter, these leakage currents are, with present technologies, sufficient to keep the state of inputs A1 and A2 unchanged. Furthermore, the extremely high resistance introduced in the feedback loops of the cell by decoupling transistors Tpd and Tnd, which are turned off, prevents a transient impulse occurring on output Q or on output B from propagating to the gates of transistors Tp1 and Tn1 of the first inverter. The state of these gates is therefore not influenced by the disturbance and outputs B and/or Q are rapidly reset to their correct state.

The drains of decoupling transistors Tpd and Tnd, respectively connected to inputs A1 and A2, can also be the sites of creation of transient impulses by ionizing particles. A transient impulse on the drain of a P-type transistor is however always an impulse that goes from 0 to 1, whereas a transient impulse on the drain of an N-type transistor is always an impulse that goes from 1 to 0. A transient impulse produced on the drain of decoupling transistor Tpd can therefore make transistor Tp1 go from on state to off state, but never the opposite. Similarly, a transient impulse produced on the drain of the decoupling transistor Tnd can make transistor Tn1 go from on state to off state, but never the opposite. In such a situation, output B of the first inverter 1 is in a high-impedance state and its electric state does not change, at least not in the short term. The effect of the disturbance therefore remains confined on input A1 or A2 concerned by the disturbance. Then input A1 or A2 concerned by the disturbance is slowly brought back to its correct electric state by the leakage current flowing through the channel of the corresponding decoupling transistor, Tpd or Tnd, which is always off. This leakage current is much greater than the leakage current flowing through the gate oxide of transistor Tp1 or Tn1. However, in certain situations, when output B is at high impedance, its electric state can degrade slowly. This degradation can in fact be due to the leakage-currents flowing through the channels of transistors Tp1 and Tn1, which are both off, and to the leakage currents flowing through the gate oxides of transistors Tp2 and Tn2. The leakage currents flowing through the channels of transistors Tp1 and Tn1, which are off, are then predominant and determine, in such a case, the speed of degradation of the electric state of output B. These currents do however flow in opposite directions. The speed of degradation of output B is therefore determined by their difference, which remains smaller than the current restoring input A1 or A2. In addition, the capacitance of output B is equal to the sum of the gate capacitances of transistors Tn2 and Tp2. It is therefore greater than the capacitance of input A1 or A2. Consequently, the state of the input of the first inverter concerned by the disturbance is restored much more quickly than the state of output B is degraded. Therefore, in the case of an ionizing particle affecting input A1 or A2, the leakage currents automatically restore the electric state of the cell.

As the decoupling transistors are constantly turned off, they can be very small. The memory cell according to FIG. 5 is thus hardened while at the same time minimizing the increase of the cell surface, by the use of the leakage currents flowing between the source and drain of decoupling transistors, which are turned off, connected in the two feedback loops of the cell. Holding the off state of the decoupling transistors of the feedback loop could theoretically lead to the information stored in the cell being lost. The state of the cell is however held due to the leakage currents flowing between the source and drain of these transistors, which are sufficient to compensate the leakage currents of the cell which could induce loss of this information.

The memory cell according to FIG. 5 can be completed by access circuits so as to achieve level sensitive latches (transparent latches), master-slave latches, memory cells for register files, for cells for static memory or SRAM (Static Random Access Memory) or for programmable integrated logic or FPGA (Field Programmable Gate Array) configuration memory cells.

Figure 6:
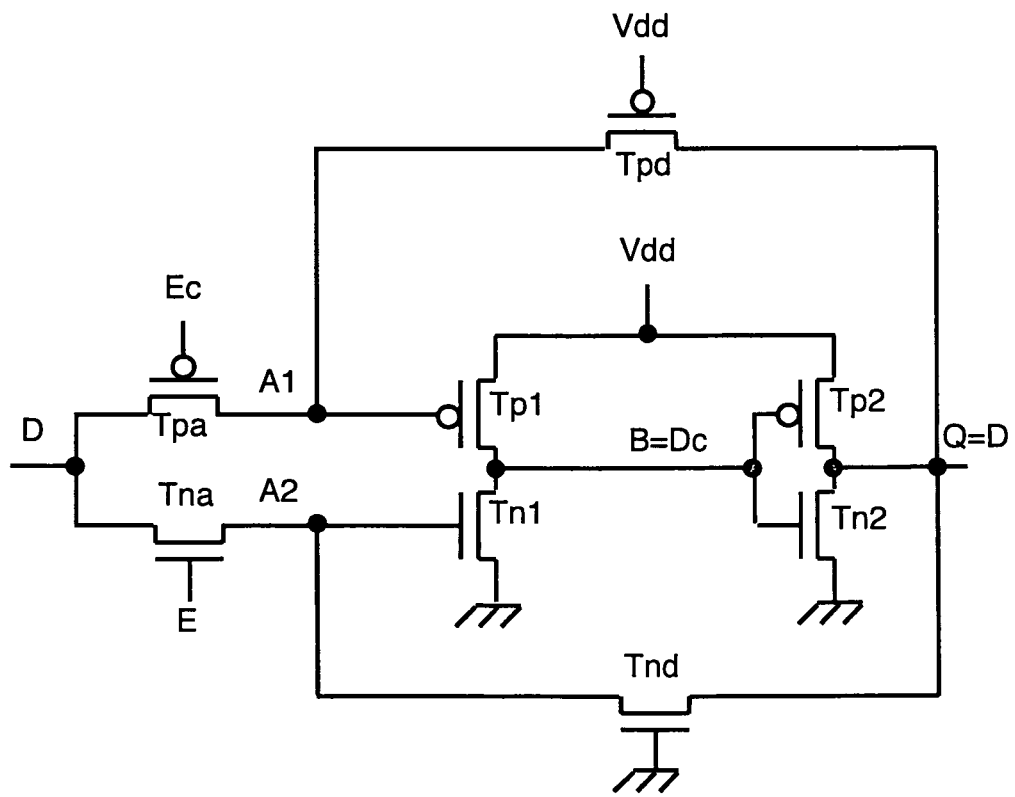
FIGS. 6 to 9 represent various alternative embodiments of the cell according to FIG. 5.

FIG. 6 represents a D-type transparent latch achieved in this way. The input D of the cell constituting the latch is connected to inputs A1 and A2 of the first inverter, respectively by means of access transistors Tpa and Tna, respectively P-type and N-type. Output Q of the second inverter constitutes the output of the latch. The cell is sequenced by a clock signal E and its complement Ec, which constitute access control signals. Clock signal E is therefore applied to the gate of access transistor Tna, whereas its complement Ec is applied to the gate of access transistor Tpa. During the high level of clock signal E (write phases), the latch is in transparent mode propagating the value applied on its input D to its output Q. Output B of the first inverter is then equal to the complement Dc of input D. During the low level of clock signal E (store phases), the latch is in the off state and stores the value present on input D during the high level of clock signal E.

Figure 7:
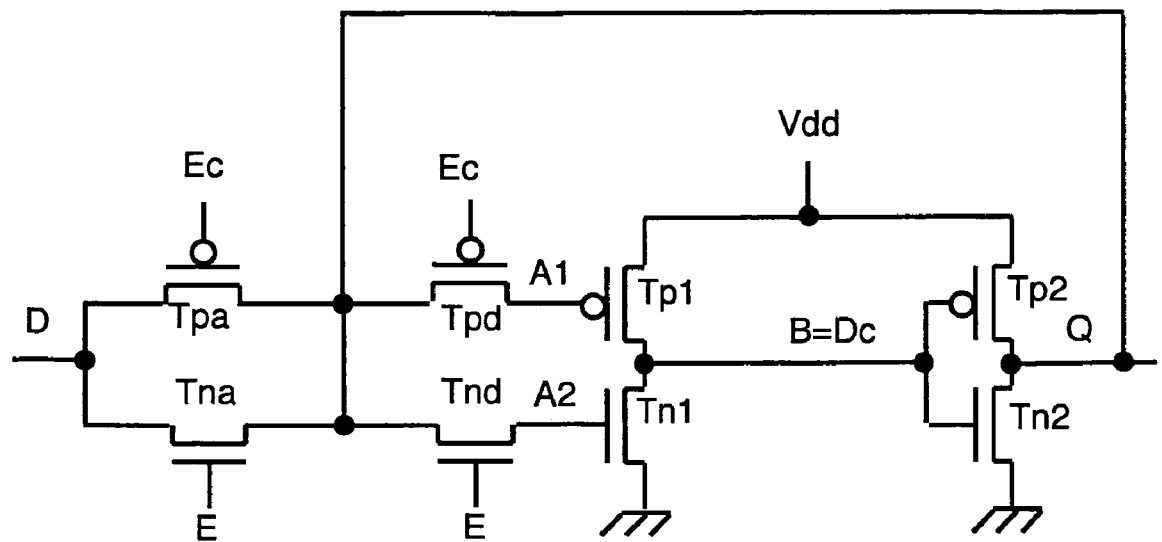

Clock signal E is held at low level during certain periods of time (hold state of the latch) so as to keep the state of the latch unchanged during these periods. During these hold periods, the leakage currents flowing through the channels of access transistors Tpa and Tna can then compete with the leakage currents flowing through the channel of decoupling transistors Tpd and Tnd and serve the purpose of refreshing the inputs A1 and A2 of the first inverter. To avoid possible problems related to this situation, the configuration of the memory cell can be modified as represented in FIG. 7. In this alternative embodiment, access transistors Tpa and Tna are not connected between input D of the cell and inputs A1 and A2 of the first inverter, but between input D and output Q of the second inverter. Decoupling transistors Tpd and Tnd are then connected in the shortest path between input D of the latch and inputs A1 and A2 of the first inverter. They are inserted both between input D and output Q of the latch and in the write path of the latch, i.e. between input D of the latch and the inputs of the first and second inverter. In this embodiment, the leakage currents of access transistors Tpa and Tna do not influence the electric state of the gates of transistors Tp1 and Tn1. Moreover, the gates of decoupling transistors Tnd and Tpd are not connected to the ground and to supply voltage Vdd, but respectively to clock signal E and to its complement Ec. Decoupling transistors Tpd and Tnd are thus, like access transistors Tpa and Tna, in the on state in write phase, i.e. when clock signal E is at high level, thereby enabling the value of input D to be imposed on the latch. They are however always off in store phase, i.e. during the low level of clock signal E, thereby protecting the value stored in the latch against disturbances due to ionizing particles.

As the two access transistors Tpa and Tna are not connected directly to the gates of transistors Tp1 and Tn1 of the first inverter, the transient impulses induced by particles affecting these transistors do not influence the value stored in the cell. One of these access transistors can therefore be eliminated. This modification is illustrated in FIG. 8, in which access transistor Tpa has been eliminated.

Figure 8:
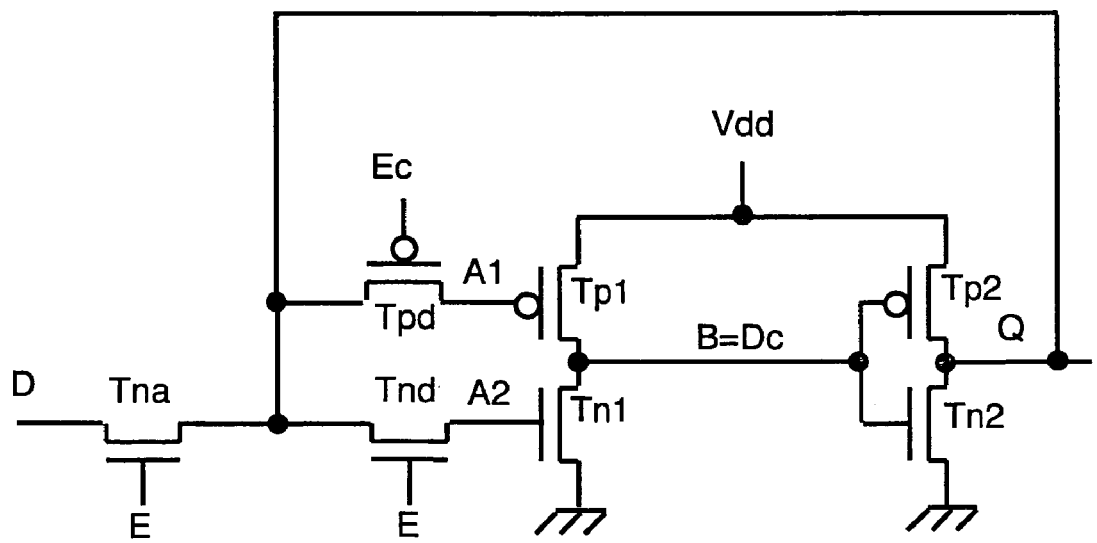

In a cell according to FIG. 7 or 8, a new value present on input D of the cell can nevertheless be in conflict with the value of output Q of second inverter 2. This conflict can give rise to an additional delay for the write time of the cell, and can furthermore increase the power consumption during a write phase of the cell. To avoid these problems, in the cell illustrated in FIG. 9, second inverter 2 is replaced by an inverter circuit formed by a gate 3 with 3 states (1, 0 and high impedance) controlled by clock signal E and by its complement Ec in such a way that the output of this gate is in high-impedance state when clock signal E is at high level, i.e. during a write phase. This enables the conflict mentioned above to be eliminated.

Figure 9:
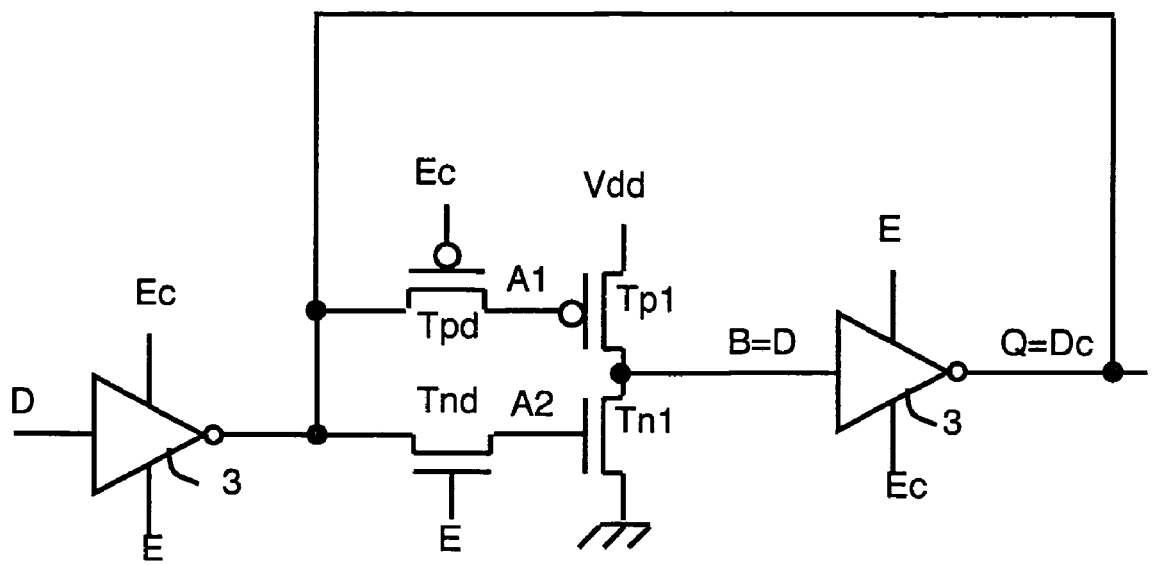

In FIG. 9, access transistors Tpa and/or Tna forming the access circuits of the cell are also replaced by an inverting transmission gate 3 with three states. This gate is controlled by clock signal E and by its complement Ec in such a way that the gate constituting the access circuit is at high impedance when the gate constituting the second inverter transmits and behaves as a simple inverter, and vice-versa. This enables the quality of the signal applied to input D of the latch to be improved, thus improving its performances (speed, consumption). The cell then comprising 3 successive inverting circuits (first gate, first inverter and gate constituting the second inverter), the output signal of the cell is then constituted by the complement Dc of the signal present on input D.

Figure 10:
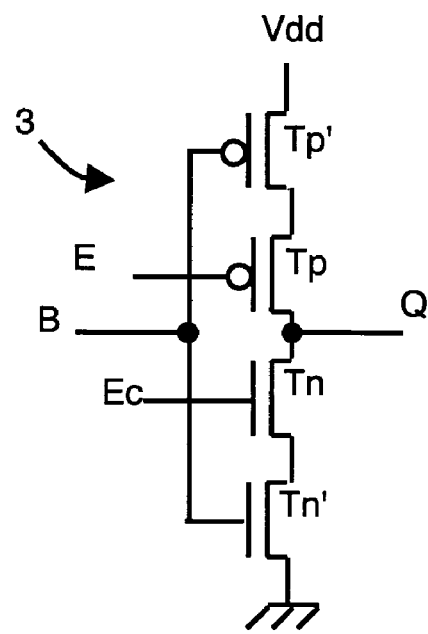
FIG. 10 represents a particular embodiment of a three-state gate constituting an inverter circuit of the cell according to FIG. 9.

As represented in FIG. 10, a three-state gate 3 can be constituted by a series circuit successively comprising two P-type transistors Tp' and Tp and two N-type transistors Tn and Tn' in series between two supply terminals, for example Vdd and ground in FIG. 10. The gates of transistors Tp' and Tn' are connected to the input of the inverter (input B for example for the second inverter). The point common to the two central transistors Tp and Tn constitutes the output of the inverter (output Q for example for the second inverter). The first and second control inputs of the gate are constituted respectively by the gates of transistors Tp and Tn. In FIG. 9, the first control input of the gate constituting the second inverter and the second control input of the first gate receive clock signal E, whereas the second control input of the gate constituting the second inverter and the first control input of the first gate receive its complement Ec.

Figure 11:
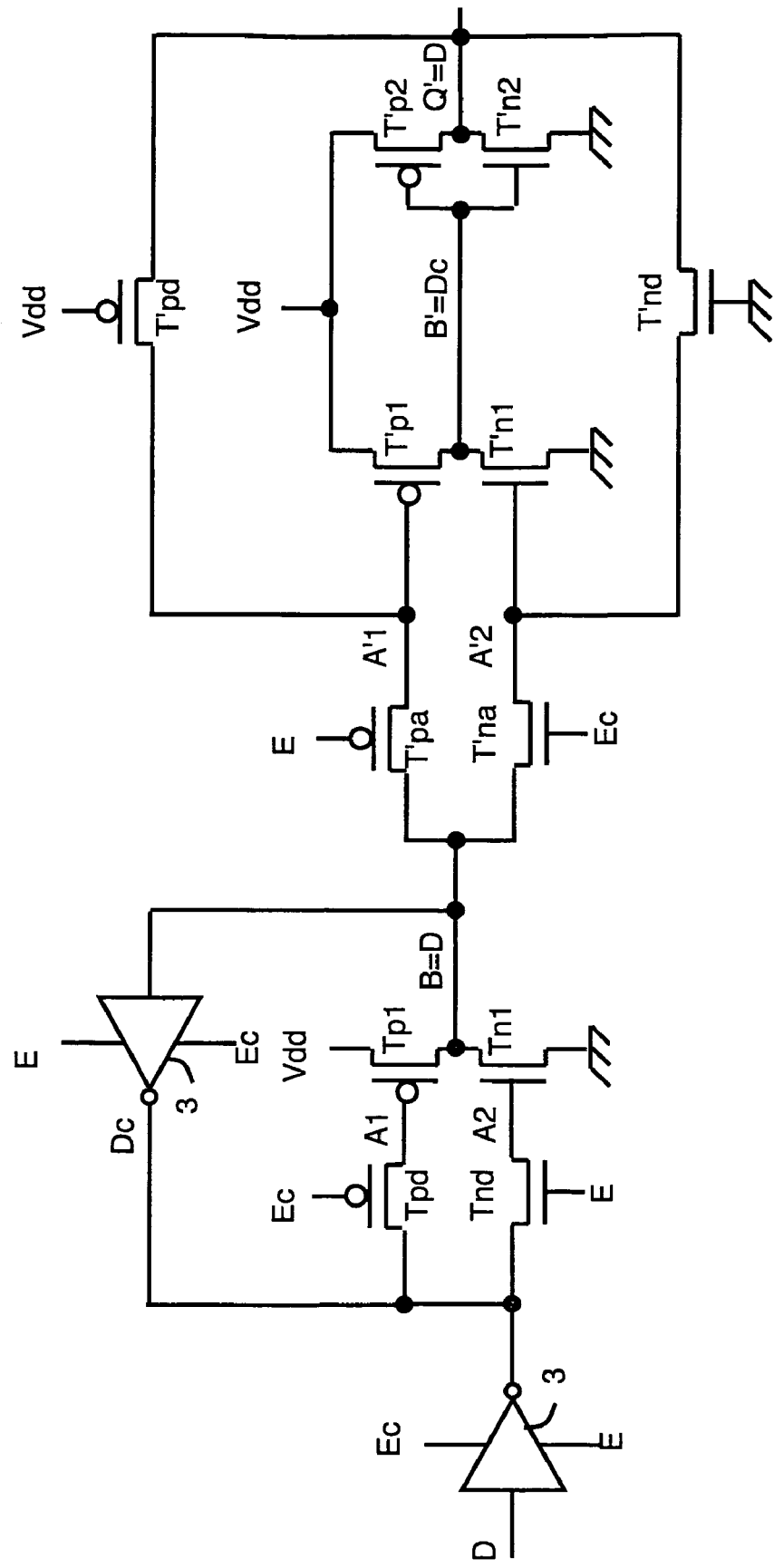
FIGS. 11 to 16 illustrate the use of cells according to the invention to achieve different types of memory cells.

Two transparent latches, for example of the type illustrated in FIG. 6, can be connected in series to form a master-slave latch. Clock signal E and its complement Ec then have to be inverted in the slave latch. As illustrated in FIG. 11, it is also possible to use different latches to achieve the master part and the slave part of a master-slave latch. In the particular embodiment of FIG. 11, the master latch is formed by a transparent latch according to FIG. 9. Output B of the first inverter of the master latch is connected to the input of a cell according to FIG. 6, constituting the slave part. Access transistors T'na and T'pa of the slave part are respectively connected to inputs A'1 and A'2 of its first inverter Tp1, T'n1, in series with its second inverter T'p2, T'n2. Output Q'=D of its second inverter is connected respectively to inputs A'1 and A'2 by means of decoupling transistors T'pd and T'nd, that are normally turned off. Clock signal E and its complement Ec are respectively applied to the gates of access transistors Tpa and T'na of the slave part. The cell according to FIG. 6 is better suited to constitute the slave part, in the case where, during the hold periods of the state of the master-slave latch (store phases), the latter is never in the situation in which the access transistors of the slave part are off and the leakage currents flowing through their channels degrade the electric state of inputs A'1 and A'2. This is the case if the hold state of the master-slave latch is achieved by forcing clock signal E to low level. In this case, transistors T'pa and T'na are normally in the on state and the problem of the leakage currents acting when these transistors are off does not arise.

Various other configurations of transparent latches and master-slave latches can be achieved using the cell of FIG. 5 as base.

The arrangement of the transistors of the cell of FIG. 6 can also be used to achieve memory cells. In the particular embodiment of FIG. 12, access transistors Tna and Tpa form a write gate and their gates are respectively connected to a write word line LmE and to a complementary write word line LmEc. Input D of the cell is connected to a write bit line LbE. A read gate, independent from the write gate, is formed by another access transistor Tna1, of N type, connected between output Q of the cell and a read bit line LbL. The gate of access transistor Tna1 is connected to a read word line LmL. In a read operation, an addressing circuit (not represented) is activated and makes the read word line go to 1. The value stored in the cell is then transmitted to read bit line LbL by access transistor Tna1. In a write operation, the value to be written is applied by a write amplifier (not represented) to the write bit line, and consequently to input D of the cell, whereas the write word and complementary write word lines go respectively to 1 and to 0.

Figure 12:
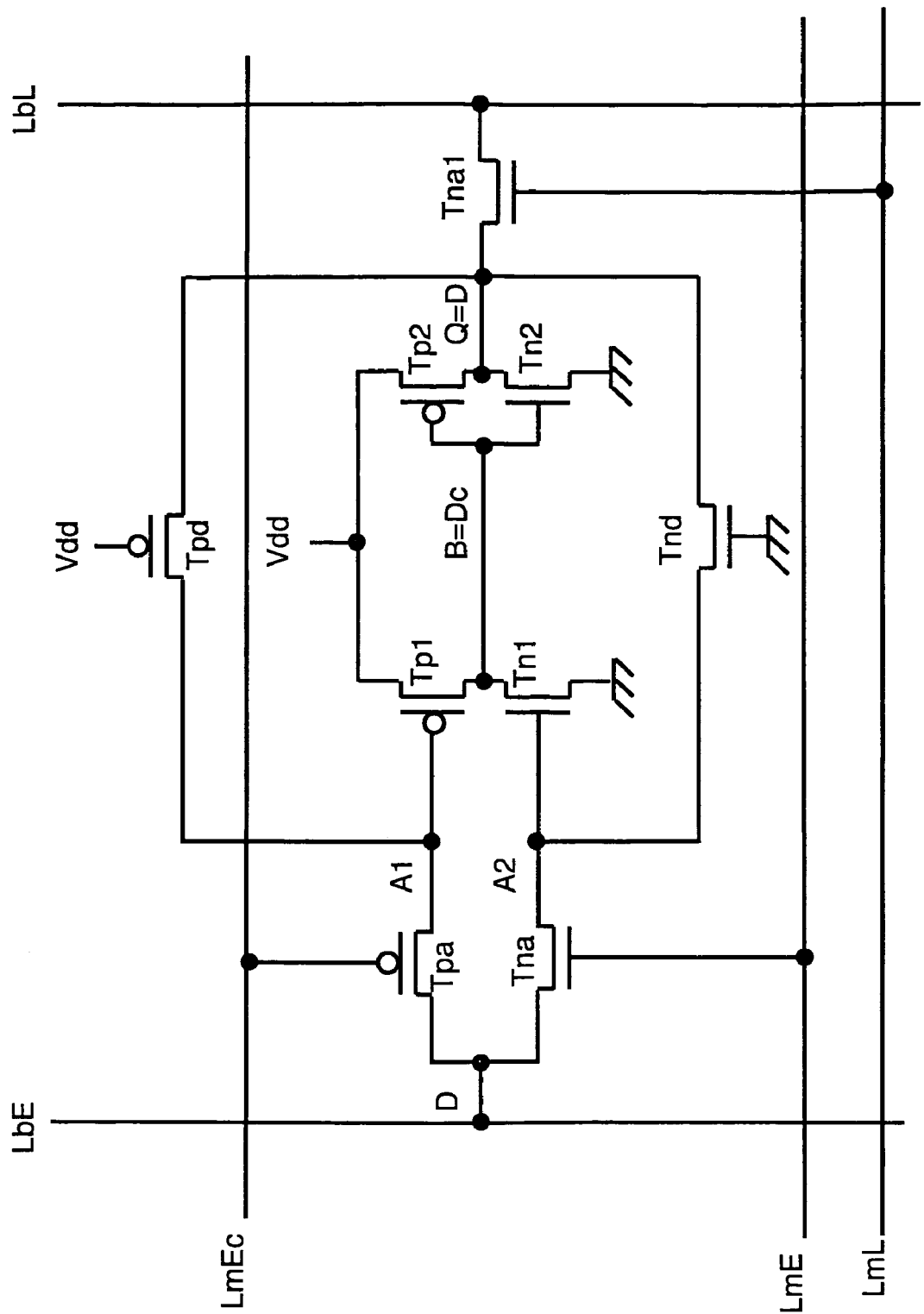

The cell of FIG. 12 is more particularly suited to implement memories having independent read and write gates, for example register file memories performing read of a word and write of another word in the same cycle, and to implement a FPGA circuit configuration memory.

To increase the write speed, a second write amplifier can be used connected to read bit line LbL during a write operation, read word line LmL being activated at the same time as write word line LmE and complementary write word line LmEc. The state of output Q of the cell is therefore modified without waiting for propagation of the value to be written by the write bit line. This does however present the drawback of not enabling a write operation on one word and a read operation on another word to be performed simultaneously. This type of embodiment therefore does not enable read of one word of the memory and write of another word to be performed in the same cycle. Nevertheless, even without this modification, the cell of FIG. 12 enables high-speed write operations to be performed. Decoupling transistors Tpd and Tnd, which are permanently turned off, do in fact prevent a conflict between the value generated by the second inverter on its output Q and the new value applied from the write gate to inputs A1 and A2 of the first inverter. They thus enable high-speed write operations. As far as the read speed is concerned, it is possible to add a complementary read bit line LbLc (not represented), and an N-type transistor Tna1c (not represented) connected between output B of the first inverter and complementary read bit line LbLc and controlled by read word line LmL. A differential amplifier can then be connected on two read bit lines carrying complementary values to perform very high-speed read operations.

Figure 13:
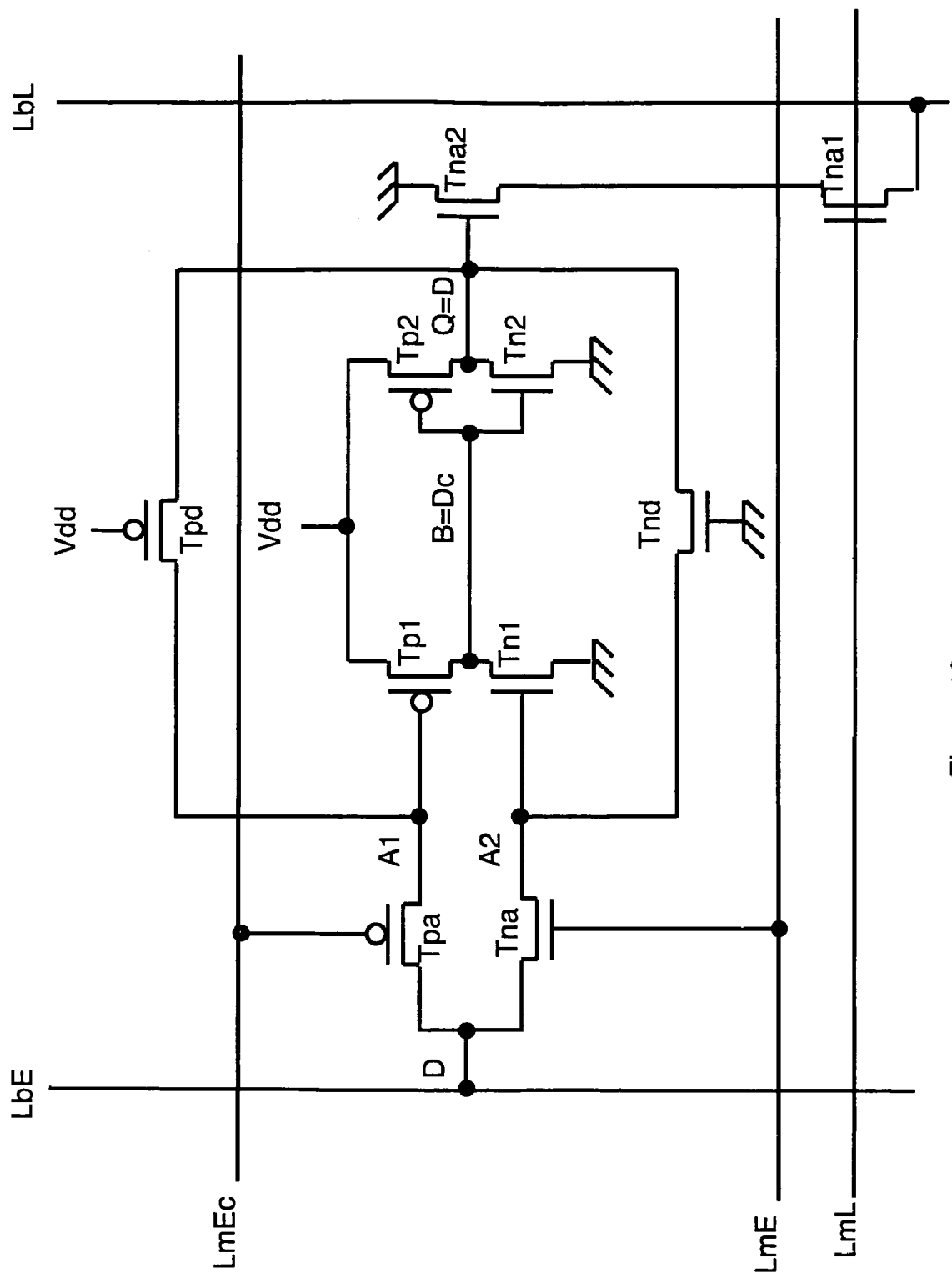

The cell according to FIG. 13 differs from the cell of FIG. 12 by the fact that an additional access transistor Tna2 is connected to the output Q of the cell. Access transistor Tna2, which is N-type, is connected in series with access transistor Tna1 between ground and read bit line LbL. The gate of access transistor Tna2 is connected directly to output Q of the cell. Prior to a read operation, read bit line LbL is precharged to the value 1. In this way, when the read operation is performed by activating read word line LmL, read bit line LbL remains at 1 if the value of output Q of the cell is 0. In this case, transistor Tna2 is in fact turned off. Read bit line LbL on the other hand goes to 0 if the value of output Q of the cell is at 1, for in this case transistors Tna2 and Tna1 are on. Although this cell uses separate word lines for read or write operations, like the cell of FIG. 12, a common word line can also be used, but the possibility of reading one word and writing at the same time another word is then lost.

In the cell represented in FIG. 12, a second read gate (not represented) can be added to form a memory having one write gate and two independent read gates. This type of memory enables a write operation for one word and a read operation for two other words to be performed in the same cycle. This type of memory is in particular suitable for producing register files used in microprocessor data paths. To achieve a second read gate in FIG. 12, a second read bit line LbL2 and a second access transistor Tna2, connected between output Q of the cell and second read bit line LbL2 and controlled by a second read word line LmL2, can be added. Similarly, a second read gate could be added in FIG. 13.

Figure 14:
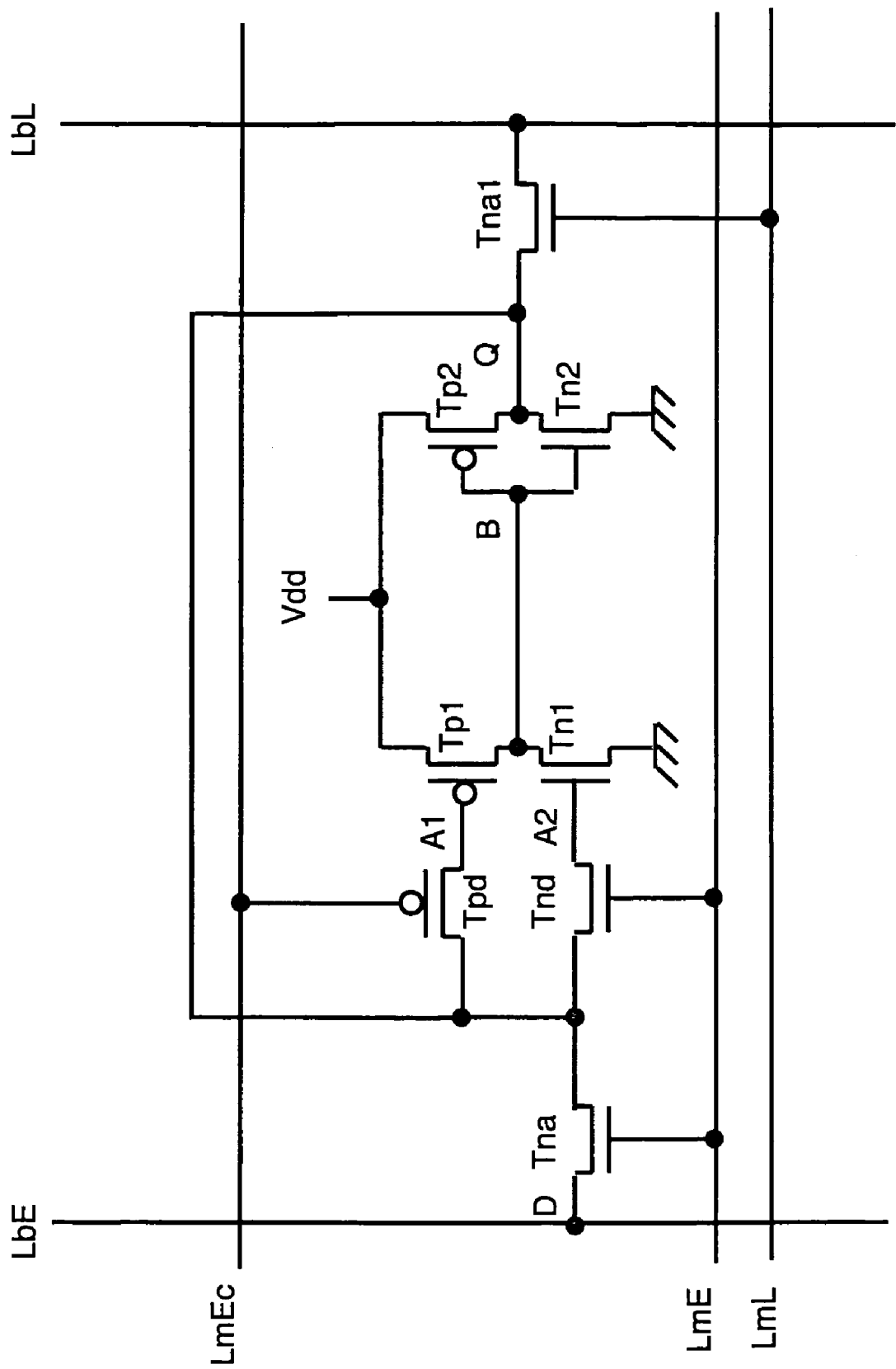

Careful simulation of the cells of FIGS. 12 and 13 has to be performed to check that the leakage currents flowing through access transistors Tpa and Tna do not adversely affect the electric state of inputs A1 and A2. A cell that is not sensitive to this problem is represented in FIG. 14. In this memory cell, based on the alternative embodiment of FIG. 8, the gates of decoupling transistors Tnd and Tpd are respectively connected to write word line LmE and to complementary write word line LmEc. As in FIG. 12, input D of the cell is connected to the write bit line, whereas output Q of the cell is connected to the read bit line by means of access transistor Tna1, the gate of which is connected to read word line LmL. The two decoupling transistors, which are normally off in store phase, are therefore on during a write operation.

One shortcoming of the cells of FIGS. 12 to 14 is that they use a write word line LmE and a complementary write word line LmEc. This requires a large number of interconnecting lines. Although this is not a great handicap, as current integrated circuit technologies do enable a large number of interconnections, it may be interesting to provide cells that only require a single write word line if this problem becomes a handicap.

Figure 15:
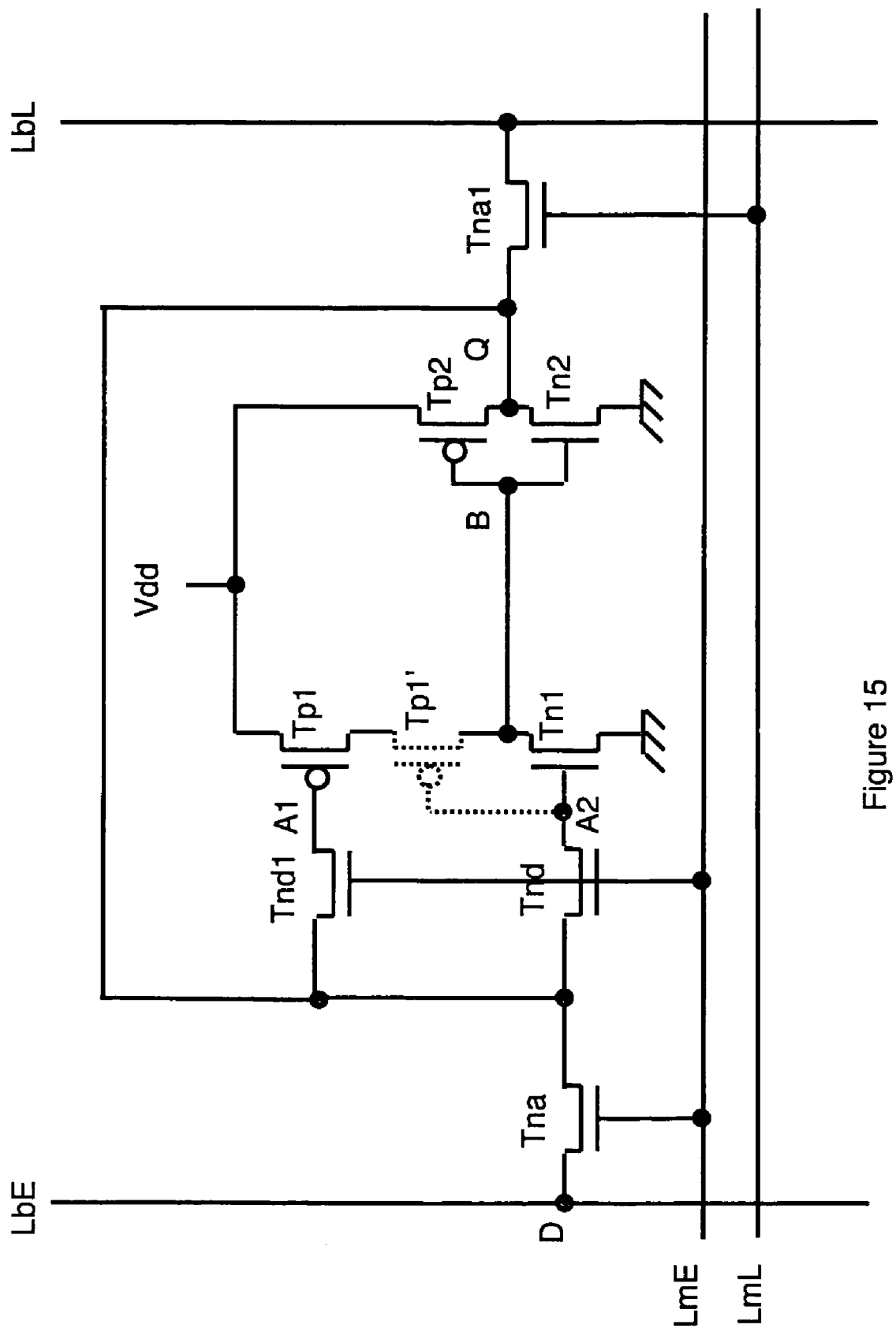

FIG. 15 represents one such cell, which differs from the cell according to FIG. 14 by the fact that the first decoupling transistor Tpd, which is P-type, is replaced by a decoupling transistor Tnd1 which is N-type. Decoupling transistor Tnd1 can therefore be controlled by write word line LmE, like the second decoupling transistor Tnd, which enables the complementary write word line LmEc to be eliminated. However, when the correct value of output Q is equal to 1, like inputs A1 and A2, an ionizing particle affecting the drain of decoupling transistor Tnd1 can produce a transient impulse going from 1 to 0 on the input A1 and make transistor Tp1 switch to on state. If no particular precautions are taken, this disturbance can then propagate to outputs B and Q of the first and second inverters and can modify the state of the cell. This propagation is nevertheless counteracted by the fact that input A2 remains at 1 and that the current flowing through transistor Tn1 opposes this propagation. This current should, in principle, maintain the correct state of the cell, for, in on state, the current flowing through an N-type transistor is greater than the current flowing through a P-type transistor of the same size. Increasing the width of the channel of transistor Tn1, thereby decreasing its resistance, may improve the situation.

Another, more robust solution consists in fitting an additional P-type transistor Tp1' (broken line in FIG. 15) connected in series between transistors Tp1 and Tn1 in the first inverter. Output B of the first inverter is then taken on the node which connects the drains of transistors Tn1 and Tp1'. The gate of additional transistor Tp1' is connected to input A2, i.e. to the drain of second decoupling transistor Tnd. As the state of this input A2 is not affected by an ionizing particle striking input A1, transistor Tp1' remains off and prevents propagation of a disturbance produced on input A1.

Similarly, it is possible to achieve a cell in which the two decoupling transistors are P-type, but this solution is less advantageous than the one using two N-type decoupling transistors. In this case, to obtain a good protection against the particles striking the P-type decoupling transistor connected to the gate of transistor Tn1, the current flowing in on state through P-type transistor Tp1 of the first inverter must in fact be greater than the current flowing in on state through N-type transistor Tn1 of the first inverter. It is also possible to fit an additional N-type transistor, connected in series between transistors Tp1 and Tn1, in the first inverter. The gate of this additional transistor is then preferably connected to input A1, i.e. to the drain of first decoupling transistor Tpd.

One drawback of a cell in which the two decoupling transistors are of the same type is that a transient impulse pushing output Q beyond the limits of the power supply line potential may propagate both to input A1 and to input A2. For example, if in the cell of FIG. 15, output Q and inputs A1 and A2 are at 1, a transient impulse making output Q go to a negative voltage Vq such that −Vq>VTn, VTn being the threshold voltage of decoupling transistors Tnd and Tnd1, propagates to inputs A1 and A2, and then to the whole of the cell, thereby inverting its state. This situation requires the action of relatively energetic ionizing particles to push the voltage of output Q of the cell to such a negative value Vq (−Vq>VTn) and to keep it there during a sufficiently long time to change the value of inputs A1 and A2 via transistors Tnd1 and Tnd. The action of such a charge is moreover limited by the stray diodes formed by the drains/sources of the N-type transistors connected to output Q and by their P-type sinks. These diodes absorb any excess negative charge taking the voltage of output Q to a negative value Vq such that −Vq is greater than their threshold voltage. Consequently the use of decoupling transistors (Tnd, Tnd1) of the same type, as in FIG. 15, enables the complexity of the cell to be reduced, but provides lesser protection.

Figure 16:
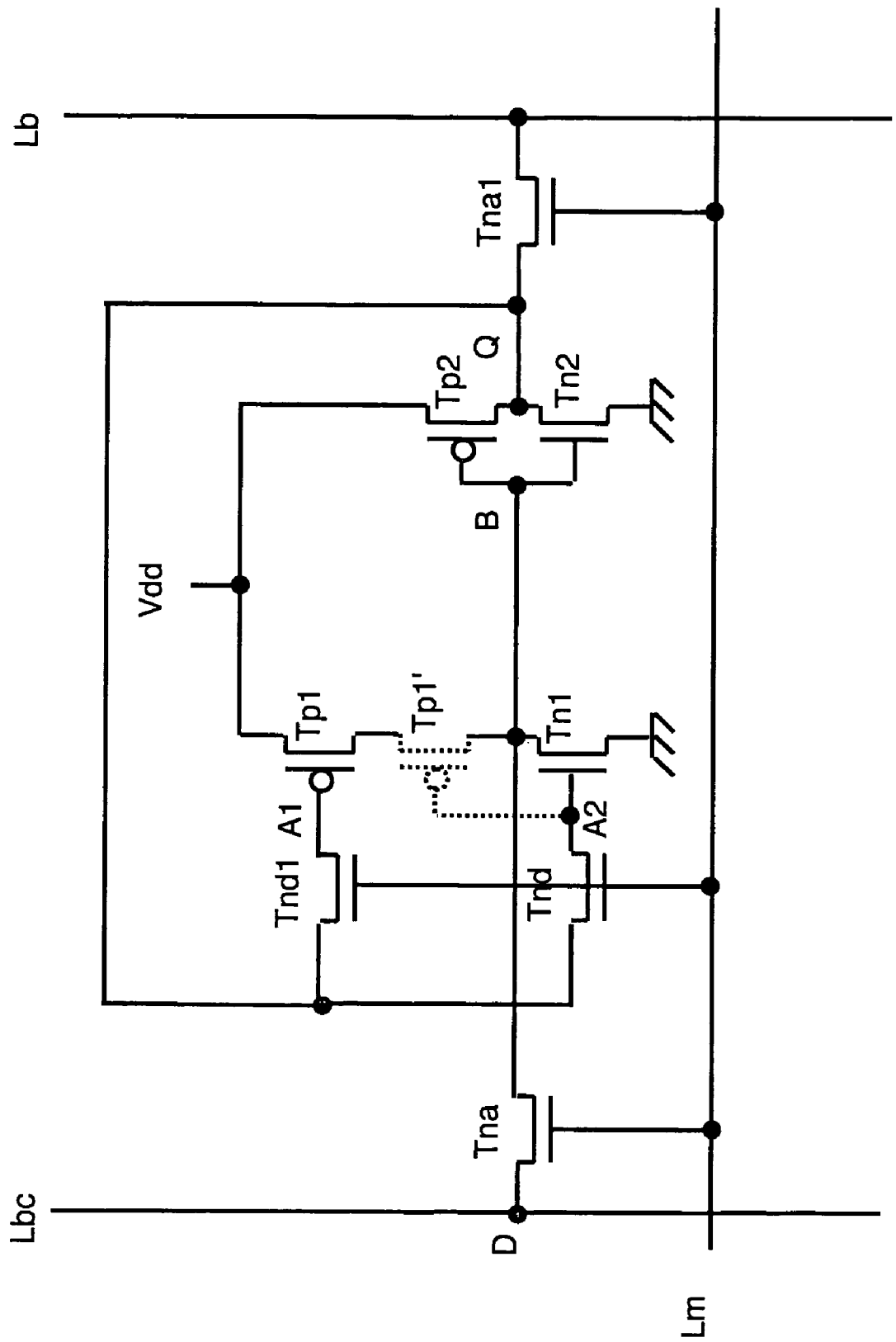

The cells of FIGS. 12 to 15 use a single read bit line LbL in read phase. This is a drawback for large memories in which the capacities of the bit lines are large and their charging or decharging by the cell in read phase may require a long time. In this case, the use of differential read amplifiers (not represented) connected to a bit line Lb and a complementary bit line Lbc, as represented in FIG. 16, enables the read time to be reduced. FIG. 16 differs from FIG. 15 by the fact that read bit line LbL, write bit line LbE and write word line LmE are respectively replaced by bit line Lb, complementary bit line Lbc and a word line Lm. Read word line LmL is eliminated and the gate of transistor Tna1 is connected to word line Lm. In addition, access transistor Tna is connected between input D of the cell and output B of the first inverter and not to output Q of the second inverter. During a write phase, the write amplifiers are connected to bit line Lb and to complementary bit line Lbc and word line Lm is set to 1. Prior to a read operation, bit line Lb and complementary bit line Lbc are precharged to a value-close to Vdd/2. During a read operation, word line Lm is set to 1 and the read differential amplifier connected to bit line Lb and to complementary bit line Lbc determines the value read in the cell. It has been seen above that the use of decoupling transistors of the same type results in lesser protection. To obtain a more robust cell, N-type decoupling transistor Tnd1 of FIG. 16 can be replaced by a P-type decoupling transistor. In this case, a complementary word line Lmc is used to control the gate of decoupling transistor Tpd.

Another drawback of the cell according to FIG. 16 is linked to the fact that, during a read phase, complementary bit line Lbc is connected to output B of the first inverter. If a transient impulse has affected input A1 or A2 and set output B of the first inverter to high-impedance state shortly before the read operation (so that the cell has not had time to restore the electric state of the affected input or output), connection of complementary bit line Lbc to output B may have harmful effects, such as an incorrect read result or an inversion of the state of the cell. Such a situation however seldom occurs in a large size memory, as the probability of reading a cell in a given time is inversely proportional to the number of words of the memory. In addition, during a read operation, word line Lm sets the two decoupling transistors Tnd and Tnd1 to on state. Output B can therefore bring inputs A1 and/or A2 to their correct state and reinforce the state of the cell. The final result depends on electrical characteristics of the circuit, such as the size of the cell transistors, the capacities of inputs A1, A2 and outputs B, Q, of the inverters and of bit lines Lb, Lbc, the precharging potential, the level of the power supplies and the dimensioning of the read amplifiers. A precise simulation of the circuit is necessary to evaluate its sensitivity to this phenomenon and re-dimensioning of the circuit may be necessary to improve its robustness.

Figure 17:
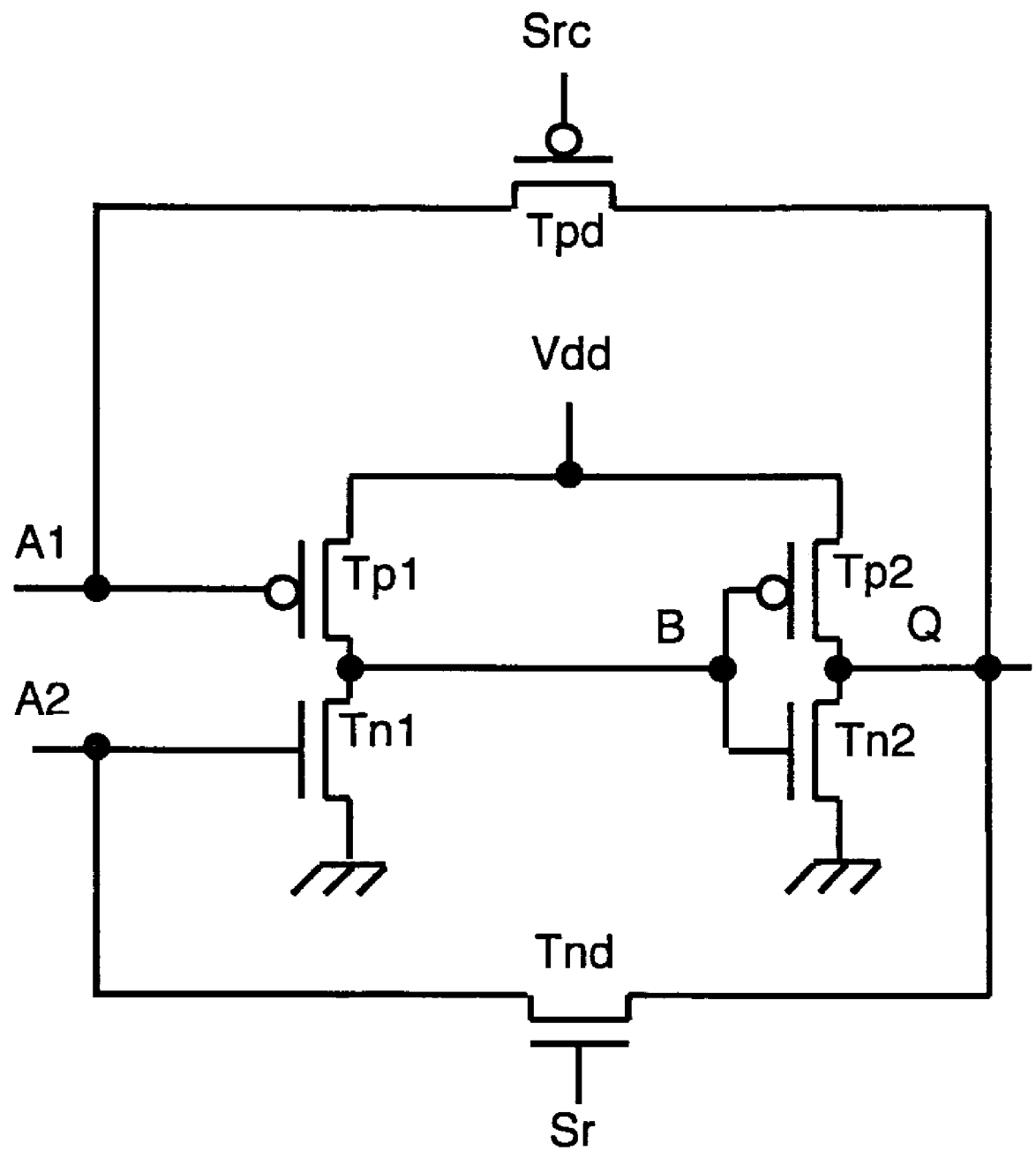
FIGS. 17 and 18 represent two other embodiments of a memory cell according to the invention.

The memory cell according to FIG. 17 differs from the cell according to FIG. 5 by periodic application of preferably complementary refresh signals to the gates of decoupling transistors Tpd and Tnd. The state stored in the cell is then held using a refresh signal which periodically switches the decoupling transistors, which are normally off outside the write phases, to the on state for a short period.

In the particular embodiment represented in FIG. 17, a refresh signal Sr is applied to the gate of decoupling transistor Tnd and its complement Src is applied to the gate of decoupling transistor Tpd. Refresh signals Sr and Src are periodic low-frequency signals which keep decoupling transistors Tnd and Tpd turned off most of the time and only turn them on periodically during short refresh intervals. Control of the decoupling transistors by refresh signals in particular enables the arrangements of the transistors of any one of the cells according to FIGS. 5 to 16 to be used without having to worry whether the leakage currents, in particular those of the access transistors, could impair the state of the cell. Moreover, in the alternative embodiments in which a bit line is connected to output B of the first inverter during the read operations, the use of these refresh signals reduces the likelihood of performing a read operation when output Q of the cell is at high impedance due to a disturbance affecting input A1 or A2.

Periodic refresh signal Sr takes the value 1 during a short time interval within period T. The duration of this time interval is calculated according to the time required for the state of output Q of the cell to restore a degraded state of input A2. This restoration is performed by means of the current flowing through the channel of decoupling transistor Tnd, which is in on state during this time interval. Refresh signal period T can be determined from various considerations.

First of all, if the leakage currents tend to degrade the state of input A2, period T will be shorter than the time necessary for these currents to modify the logic state of input A2. Furthermore, in the alternative embodiments in which a bit line is connected to output B of the first inverter during read operations, as in FIG. 16, period T can be selected such as to reduce the probability of performing a read operation while output B of the first inverter is in high-impedance state due to a disturbance affecting input A2. In this case, period T is determined in such a way that the probability of reading a given memory word within a period T remains low. For example, in a memory comprising 500,000 words, supposing that a read operation is performed on average in one cycle out of two, each word is read on average every 1,000,000 cycles. Therefore if period T then has a duration of 1,000 cycles, the above-mentioned probability is very low. Refresh signal Src has similar characteristics. The same period and the same refresh interval (the smaller of the two periods and the larger of the two refresh intervals) can then be used for both the refresh signals, thus enabling the complement of signal Sr to be used as refresh signal Src.

The refresh signals can be used for control of the decoupling transistors in any type of cell, for example of the transparent or master-slave latch type, SRAM memory cell type, or a memory cell having a read gate and a write gate, in particular in the cells according to FIGS. 6 to 9 and 11 to 16. If the two decoupling transistors are identical, as in FIGS. 15 and 16, they are then controlled by a single refresh signal applied to the gate of the two decoupling transistors. In the case of a latch using refresh signals, it is only useful to activate these signals when operation of the latch is disabled by disabling of the clock signals which sequence it (hold state). This type of disabling is activated by signals which force the clock signals to low or high level during a certain number of cycles. These signals can then be used to disable the refresh signals when the clocks are not disabled, which generally represents most of the time.

Whereas in the memory cell according to FIG. 5 permanent turn-off of the decoupling transistors is achieved by connecting their gates to supply voltage Vdd or to ground, it is also possible to turn an N-type decoupling transistor off by any voltage Vn lower than its threshold voltage VTn (Vn<VTn) and to turn a P-type decoupling transistor off by any voltage Vp such that Vdd-Vp is less than its threshold voltage VTp, in other words Vp>Vdd-VTp. To increase the leakage currents of turned-off transistors Tpd and Tnd, the voltage Vp selected is less than Vdd and the voltage Vn higher than 0, i.e. Vdd>Vp>Vdd-VTp and 0<Vn<VTn. The voltages Vn and Vp applied to the gates of the decoupling transistors can be obtained by any suitable means. Such a memory cell with degraded potentials is illustrated, in FIG. 18.

Figure 18:
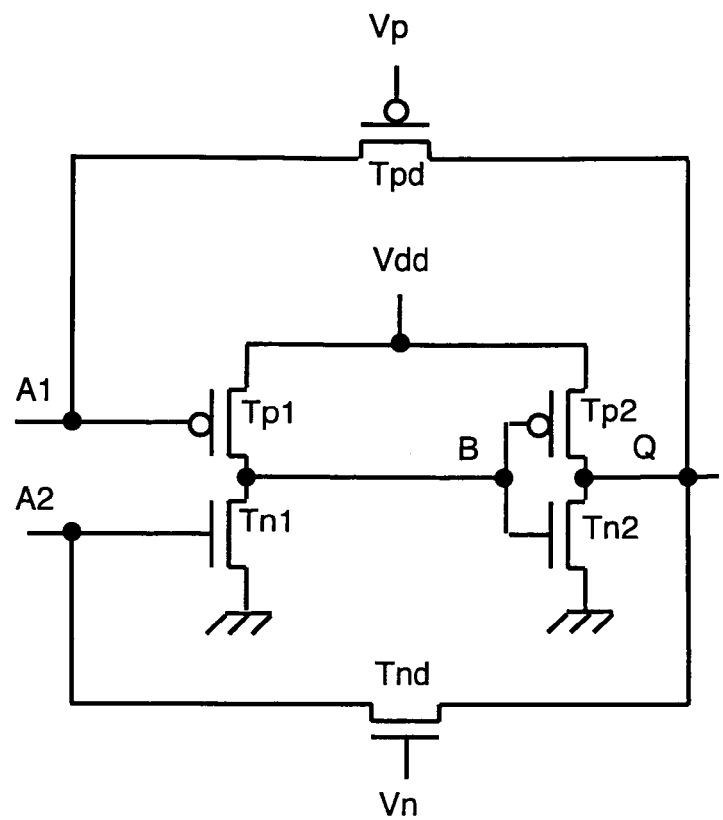

In a cell according to FIG. 18, the currents restoring the correct state of inputs A1 and A2 are higher than the leakage currents flowing through the turned-off decoupling transistors of a cell according to FIG. 5, which solves the problems linked to the weakness of these currents. If the voltage applied to the gate of an NMOS transistor is lower than the threshold voltage of this transistor, this transistor is in fact turned off. In this state, the only current between its source and drain is a leakage current.

The value of this leakage current depends on the voltage applied to the gate of the NMOS transistor. The closer this voltage is to the threshold voltage of the transistor, the higher this current is. An increase of 80 mV of the voltage applied to the gate of the NMOS transistor multiplies its source-drain leakage current approximately by a factor 10, provided this voltage remains lower than its threshold voltage. For example, in a technology in which the threshold voltage VTn of the NMOS transistors is 0.5V, the threshold voltage VTp of the PMOS transistors is 0.5V and the supply voltage Vdd is 1.8V, applying a voltage Vn of 0.4V to the gate of decoupling transistor Tnd of FIG. 18 multiplies the source-drain leakage current of this transistor by approximately 100,000 compared with the source-drain leakage current of decoupling transistor Tnd of FIG. 5. Thus, if in FIG. 5 the leakage current of decoupling transistor Tnd takes 300 µs to restore the value of node A2, the duration of this restoration in FIG. 18 will be 3 ns only. The use of a decoupling transistor Tnd controlled by a voltage Vn lower than its threshold voltage VTn but close to this threshold voltage therefore prevents any danger of the source-drain leakage current of an access transistor Tna degrading the level of node A2. This type of solution is therefore more particularly suited to cells of the type represented in FIGS. 6, 12 and 13 for which this danger exists. Moreover, if the level of node A2 is degraded following the impact of an ionizing particle, the use of a decoupling transistor Tn controlled by a voltage Vn lower than its threshold voltage VTn but close to this threshold voltage restores the correct value of this node within a very short time interval. Thus, if the cell forms part of a memory, the probability of it being read before the value of node A2 is restored becomes very low. This type of solution is therefore also more particularly suited to a memory cell of the type represented in FIG. 16 for which such a read operation could produce a wrong value.

A similar relationship exists between threshold voltage VTp and the source-drain leakage current of a PMOS transistor. The use of a decoupling transistor Tpd controlled by a voltage Vp such that Vdd-Vp is lower than its threshold voltage VTp, but close to this threshold voltage, enables the same types of problems to be solved as far as node A1 is concerned.

As above described, the source-drain leakage currents of decoupling transistors Tpd and Tnd are several orders of magnitude higher than the source-drain leakage currents of access transistors Tna and Tpa. The access transistors can therefore be connected to inputs A1 and A2 of the first inverter, as in FIGS. 6, 12 and 13 and in the slave part of FIG. 11, without the leakage currents of these access transistors being able to degrade the electric state of these inputs. This has the advantage of a reduced access time compared with the cells of FIGS. 7 to 9, 14 and 15 and of the master part of FIG. 11.

Another advantage of the latch of FIG. 6 compared with the latches of FIGS. 7 to 9 and of the master part of FIG. 11 lies in a reduction of the electric consumption of the cell. In the cell according to FIG. 6, clock signal E and its complement Ec in fact control two transistors (Tpa and Tna), whereas in the cells according to FIGS. 7 to 9 and in the master part of FIG. 11, clock signal E and its complement Ec control four transistors (Tpa, Tna, Tpd and Tnd) for FIG. 7, 9 and the master part of FIG. 11, and three transistors for FIG. 8. This results in a lower electric consumption for the cell of FIG. 6.

Figure 19:
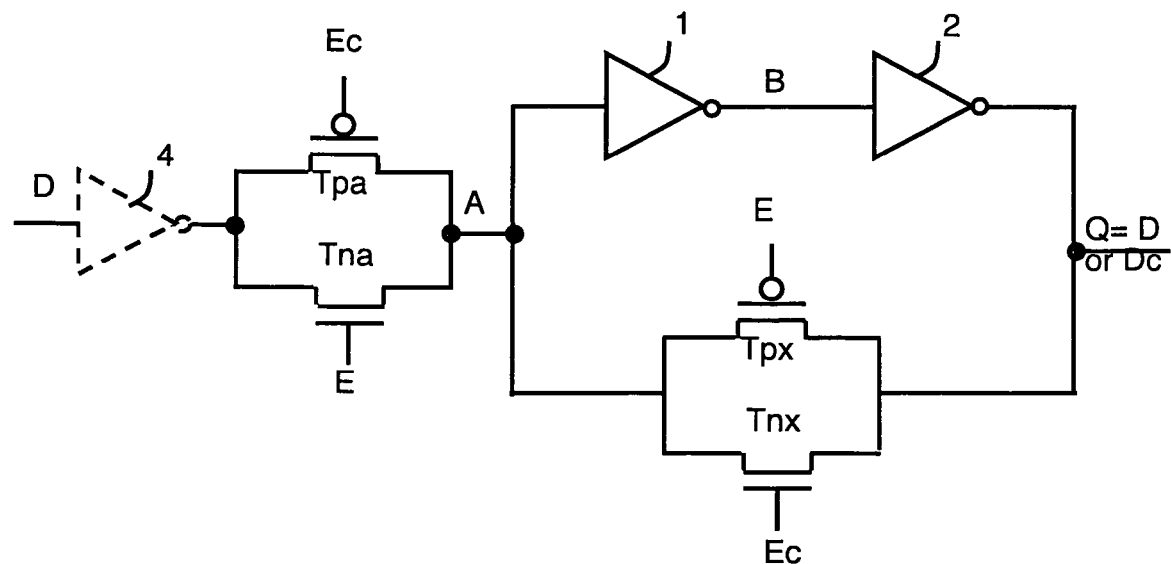
FIGS. 19 and 20 illustrate two embodiments of latches according to the prior art.
Figure 20:
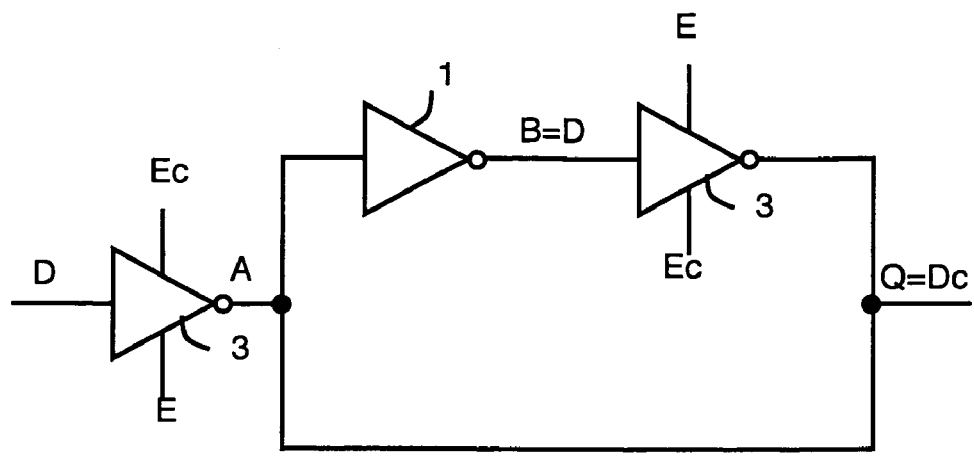

The electric consumption of the cell of FIG. 6 is also reduced compared with the consumption of a conventional latch. When a conventional latch is accessed, input A of first inverter 1 of the cell to which access transistors Tpa and Tna are connected in fact has to be disconnected from output Q of second inverter 2 to prevent a conflict between the value stored in the cell and the new value to be stored. Such a conflict reduces the speed of the latch and increases its electric consumption. An additional input inverter 4 (broken line in FIG. 19) can be connected to input D of the cell to ensure that the signal applied to the sources of access transistors Tpa and Tna is of good quality. As represented in FIG. 19, this disconnection is conventionally performed by disconnecting transistors Tpx and Tnx connected in parallel between output Q of second inverter 2 and input A of the first inverter. Clock signal E applied to the gate of, the access transistor Tna and its complement Ec applied to the gate of access transistor Tpa are then respectively applied to the gates of disconnecting transistors Tpx and Tpn. In a known alternative embodiment illustrated in FIG. 20, this disconnection can also be performed using a three-state gate 3 of the type represented in FIGS. 9 and 10 to constitute second inverter 2. Gate 3 is then controlled by clock signal E and its complement Ec. Conflict is avoided by turning disconnecting transistors Tpx and Tnx off or by commanding the three-state gate to the high-impedance state at each write operation in the latch. This command is however also a source of electric consumption. The conventional latches represented in FIGS. 19 and 20 therefore have a higher electric consumption than the consumption of the latches according to FIG. 6.

Figure 21:
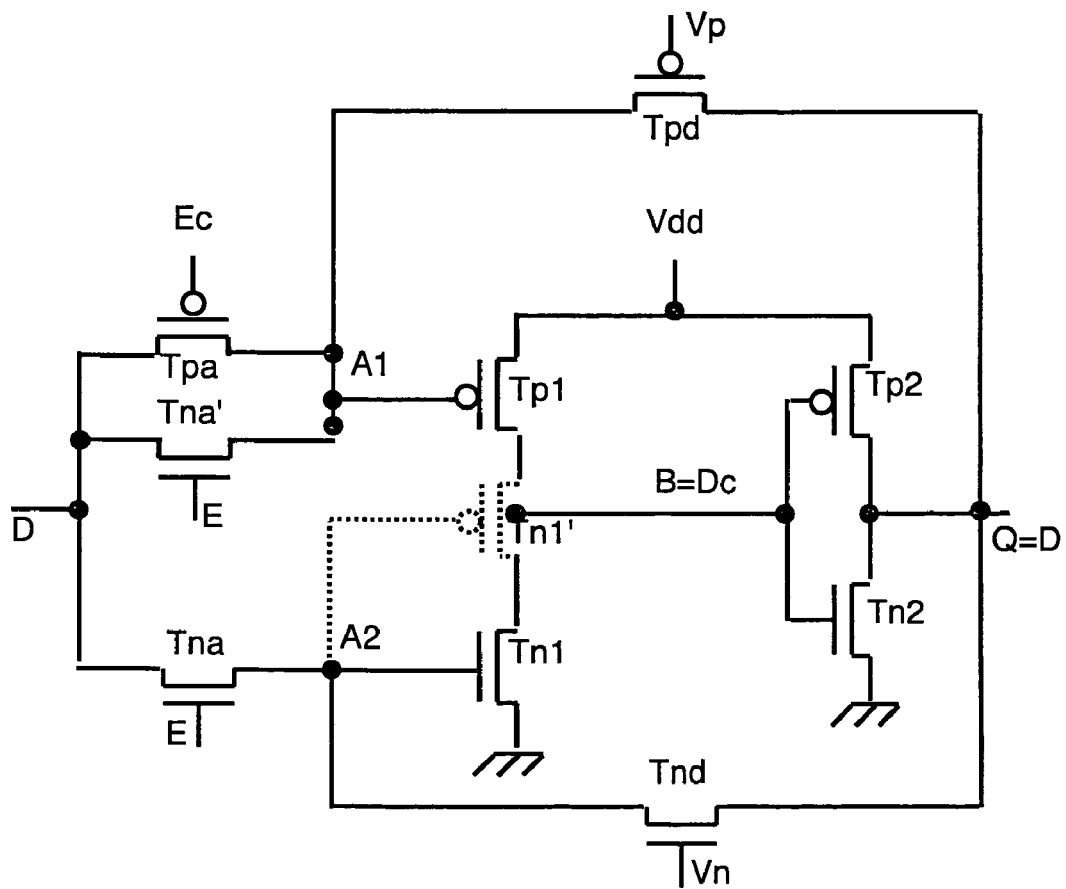
FIGS. 21 and 22 represent two other embodiments of a memory cell according to the invention.

In the embodiment illustrated in FIG. 6, the data transmission rate in write phase may prove insufficient on input A1 of the first inverter. As represented in FIG. 21, this drawback can be overcome by connecting an additional N-type access transistor Tna' in parallel with access transistor Tpa, the gate of which additional access transistor is controlled by clock signal E, like access transistor Tna. However, connecting additional access transistor Tna' to input A1, like connecting decoupling transistor Tnd1 to input A1 in FIG. 15, can enable an ionizing particle affecting its drain to transmit a transient impulse going from 1 to 0 on the input A1, turning transistor Tp1 to on state. To prevent such a disturbance from propagating to outputs B and Q, it is possible to connect an additional N-type transistor Tn'1 (broken line in FIG. 21) or an additional P-type transistor in series between transistors Tp1 and Tn1 of the first inverter, in a similar manner to FIG. 15, the gate of this additional transistor being connected to input A2 of the $1^{st}$ inverter.

Figure 22:
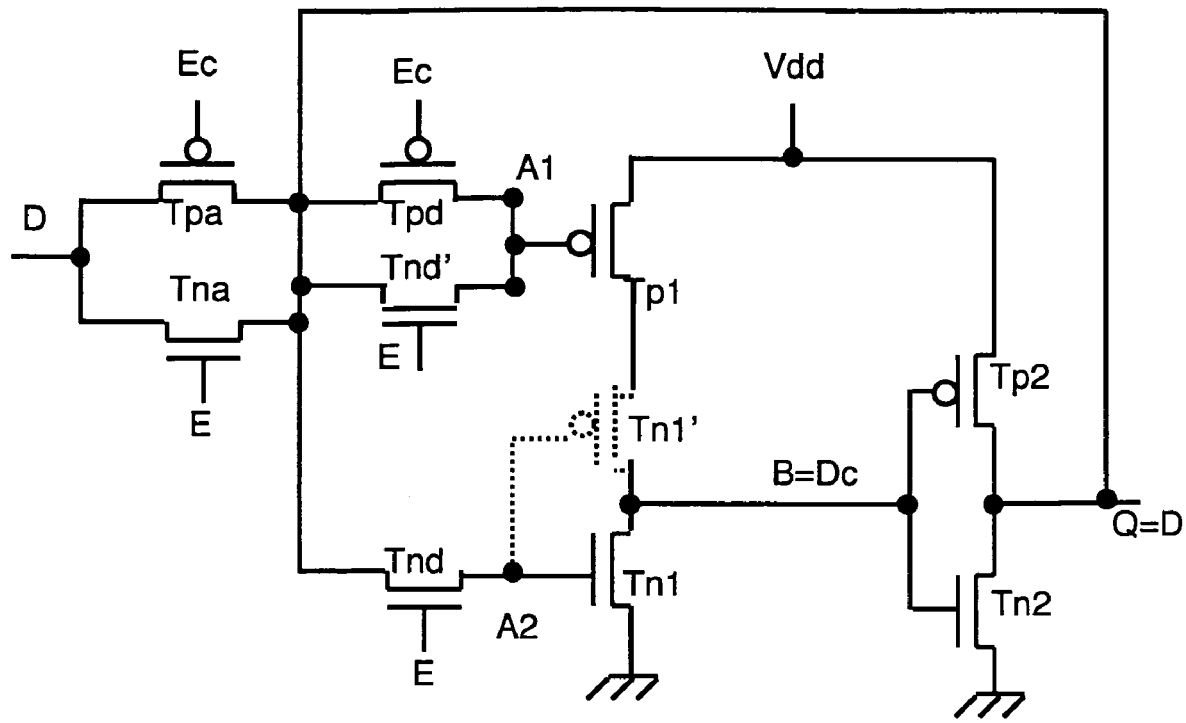

Similarly, to improve the write speed on input A1 of the $1^{st}$ inverter, the embodiment according to FIG. 7 can be modified as illustrated in FIG. 22 by connecting an additional N-type decoupling transistor Tnd' in parallel with decoupling transistor Tpd connected to input A1, the gate of this additional decoupling transistor being controlled by clock signal E. As previously, an additional transistor Tn'1 (broken line in FIG. 22) having its gate connected to input A2 is preferably connected in series between transistors Tp1 and Tn1 of the $1^{st}$ inverter.

In a complex circuit, one branch of clock signal E and one branch of its complement Ec can be used to control a large number of latches. In this case, the electric capacitances controlled by these branches are high and a powerful buffer circuit is used on each of these branches to enable it to control these numerous latches. Due to the large capacity of each branch, the charge injected on the latter by an ionizing particle striking its associated amplifier cannot modify its electric voltage significantly. Moreover, this charge is very quickly removed by the powerful buffer circuit of the branch. Ionizing particles striking the clock circuit therefore cannot give rise to errors in the latches.

Figure 23:
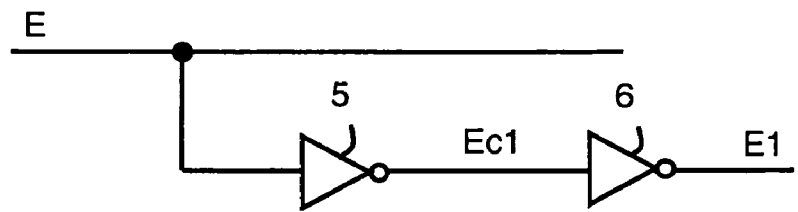
FIG. 23 illustrates an embodiment of a clock circuit according to the prior art.

In other known embodiments, as illustrated in FIG. 23, two series-connected inverters 5 and 6 are associated with each latch, which inverters locally respectively generate clock signals Ec1 and E1 designed to control the latch, from a main branch of clock signal E. In this case, the capacitances of the sub-branches supplying clock signals Ec1 and E1 are small and the associated inverters 5 and 6 are of small size. Ionizing particles striking the transistors of inverters 5 and 6 can then significantly modify the voltages of signals E1 and/or Ec1. They can then unduly connect the latch on its input D and impair the value stored in the latch.

Figure 24:
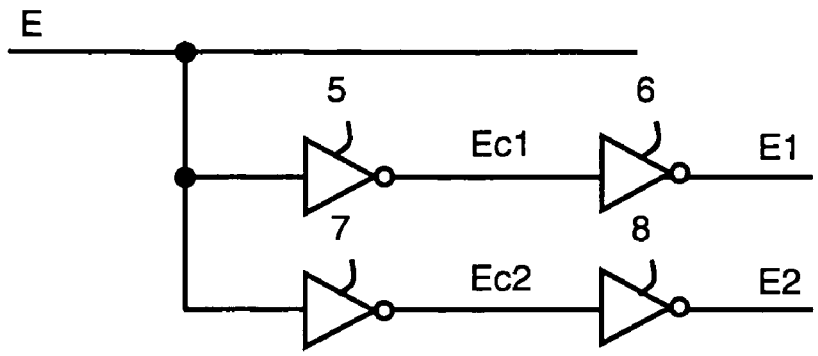
FIG. 24 represents an embodiment of a clock circuit commanding a latch according to the invention.

According to another object of the invention, illustrated in FIG. 24, the latches are protected against these disturbances by the use of two pairs of clock inverters connected in series in two distinct sub-branches. The first pair of clock inverters 5 and 6 connected in series, receiving signal E on input, supply a first clock signal E1 (at the output of inverter 6, the input of which is connected to the output of inverter 5) and its complement Ec1 (at the output of inverter 5, the input of which receives signal E). The second pair of clock inverters 7 and 8 in the same way supply a second clock signal E2 and its complement Ec2.

Two distinct sub-branches are thus associated with each latch. First clock signal E1 and its complement Ec1 are then applied to the gates of the access transistors, respectively N-type (Tna) and P-type (Tpa), in a cell according to FIG. 7 or 8 or control access gate 3 connected to the input of the latch of FIG. 9. In FIGS. 7 to 9, second clock signal E2 and its complement Ec2 are then applied to the gates of the decoupling transistors, respectively N-type (Tnd) and P-type (Tpd). In this case, if one of the inverters of one of the sub-branches is affected by an ionizing particle, the inverters of the other sub-branch associated with the same latch are not affected. The state of the latch can therefore not be unduly impaired by a particle impacting clock inverters 5 to 8 which generate clock signals E1, Ec1, E2 and Ec2.

For this protection to be efficient, decoupling transistors Tnd and Tpd do however have to be connected in the write path of the latch, as in FIGS. 7 to 9, i.e. between the input of the latch and the inputs of the two inverters, so as to block this path when a stray impulse produced by a particle unduly activates clock signals E1 and Ec1 which control the access circuit (Tpa, Tna). In a cell according to FIG. 6, in which decoupling transistors Tnd and Tpd are arranged outside the write path, control of the decoupling transistors by clock signals E2 and Ec2 would not provide this protection.

In FIGS. 7 to 9, connecting decoupling transistors Tnd and Tpd in the path connecting input D to output Q of the latch reduces the speed of the latch, all the more so as the input value is transferred to input A1 by means of a PMOS transistor only (poor 0 level transfer), and the input value is transferred to node A2 by means of an NMOS transistor only (poor 1 level transfer). The latches illustrated in FIGS. 25 and 26 enable this problem to be remedied. In these figures, the output of the latch is formed by the output (Dc) of the second inverter (Tn2, Tp2) having a single input connected by means of the access circuit (Tpa, Tna) to input D of the latch. Decoupling transistors Tnd and Tpd are, as before, connected between the output of the second inverter and the two inputs of the first inverter (Tp1, Tn1). The naming first and second inverter to respectively designate the two-input inverter (Tp1, Tn1) and the inverter (Tp2, Tn2) comprising a single common input are kept, although the order in which these inverters are connected in the loop from the input of the latch is reversed with respect to the previous figures. Decoupling transistors Tpd and Tnd are, as in FIG. 7, connected in the shortest path between input D of the latch and inputs A1 and A2 of the first inverter (Tp1, Tn1) as well as in the write path, but they are no longer arranged in the path between input D and output Qc of the latch.

Two disconnecting transistors Tpb and Tnb, respectively controlled by clock signals E1 and E1c, are connected in parallel between the output of the first inverter (Tp1, Tn1) and the common input of the second inverter (Tp2, Tn2) to prevent any conflict between the value to be written and the value of the output of the first inverter during the write phases (E1=1 and E1c=0), which could cause an over-consumption and a loss of speed. These disconnecting transistors are in fact turned off during the write phases and turned on outside the write phases to reclose the feedback loops.

Figure 25:
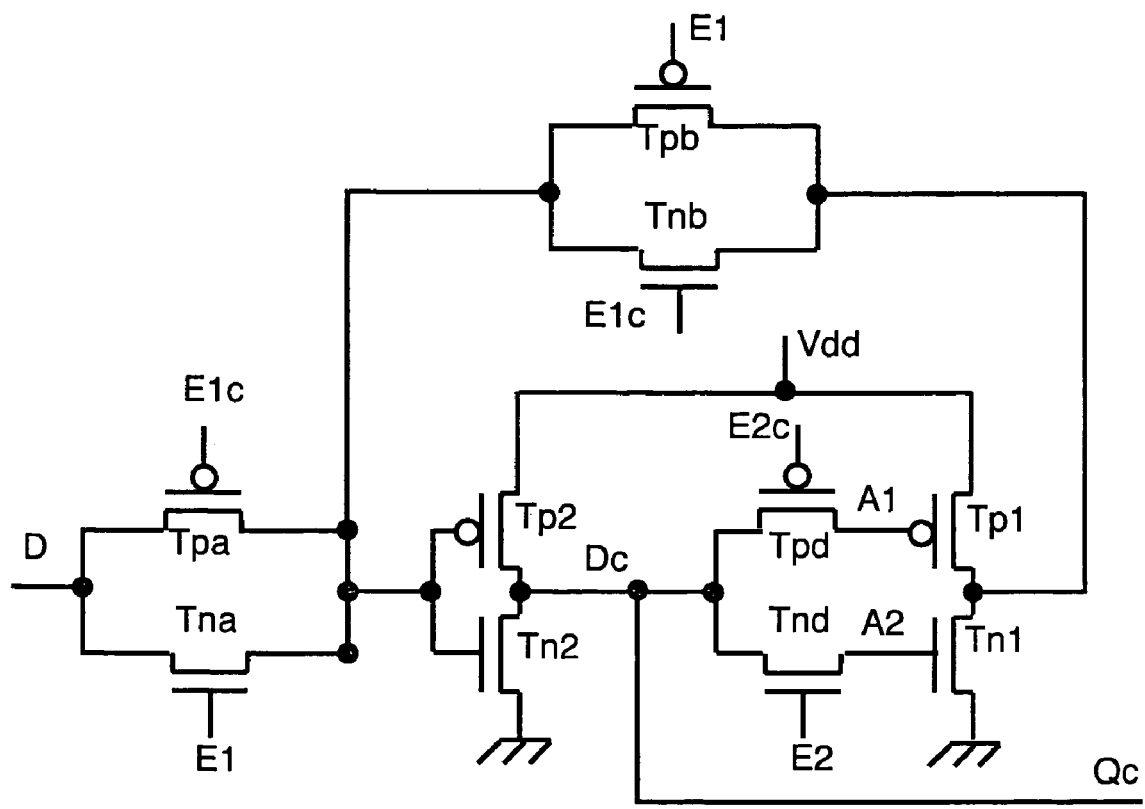
FIGS. 25 and 28 represent two other embodiments of a memory cell according to the invention.

In the embodiment of FIG. 25, clock signal E2 is then applied to the gate of decoupling transistor Tnd and its complement E2c is applied to the gate of decoupling transistor Tpd. Thus, in a write phase (E1=E2=1, E1c=E2c=0), the new input value D can reach the input and output of the second inverter (Tp2, Tn2) as well as the two inputs A1 and A2 of the first inverter (Tp1, Tn1) and modify the value of the latch. Outside the write phases, i.e. in store phases (E2=0, E2c=1), decoupling transistors Tnd and Tpd are turned off and the latch is protected against transient impulses induced by the particles striking any one of its transistors. It is also protected against transient impulses induced by the particles striking the transistors of the clock inverters which generate the clock signals (E1, E1c, E2, E2c), as decoupling transistors Tnd and Tpd, controlled by clocks E2 and E2c, are located on the write path. As before, in store phases (outside the write phases), the values of inputs A1 and A2 are held by the leakage currents flowing through the turned-off decoupling transistors Tpd and Tnd, the gates of which are then respectively at Vdd (E2c=1) and ground (E2=0).

In an alternative embodiment, the inputs A1 and A2 can be periodically refreshed. Clock signal E2 applied to the gate of decoupling transistor Tnd can therefore be replaced by a signal Fn constituted by superposition of a clock signal (E or E2) and a refresh signal Sr. The signal Fn=E+Sr or E2+Sr will thus be equal to Vdd in write phases and to Sr outside the write phases. In the same way, a signal Fp constituted by the complement Ec or E2c of the clock signal and the complement Src of the refresh signal (Fp=Ec.Src) can be used on the gate of decoupling transistor Tpd. The gate of transistor Tpd will thus be grounded in the write phases and equal to Src outside the write phases.

In the same way, signals Fn and Fp, constituted by superposition of a clock signal and a refresh signal, can be used instead of clock signals E and Ec for control of the decoupling transistors in any type of cell, in particular in the cells according to FIGS. 7 to 9 and 11 to 16.

As in FIG. 18, it is also possible to increase the leakage currents of decoupling transistors Tnd and Tpd of FIG. 25 in the store phases. Signals Fn and Fp respectively applied to the gates of transistors Tnd and Tpd during the write phase can therefore be respectively at Vdd and ground and, during the store phase (E1=0, E1c=1), respectively take values Vn, greater than zero but less than threshold voltage VTn, and Vp, which is lower than Vdd, such that Vdd−VTp<Vp<Vdd.

Figure 26:
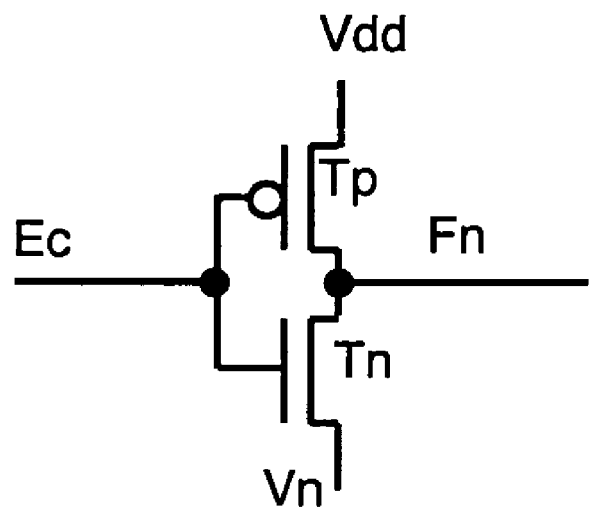
FIGS. 26 and 27 illustrate two circuits enabling the signals Fn and Fp of a cell according to FIG. 25 to be obtained.
Figure 27:
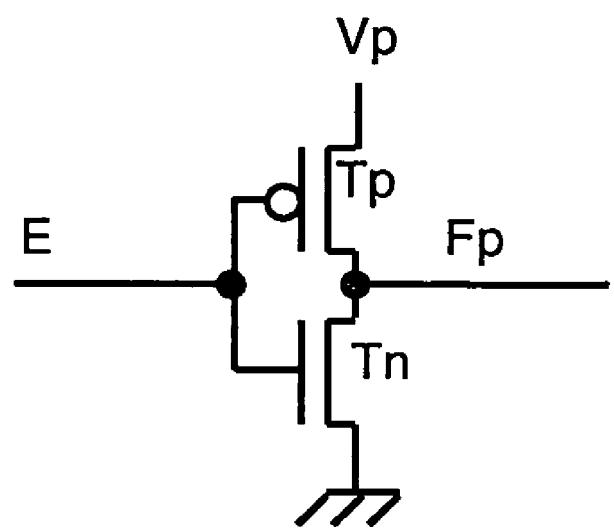

As signals Vn and Vp are not logic signals taking values 1 (Vdd) and 0 (ground), signals Fn and Fp cannot then be produced simply by means of logic gates. FIGS. 26 and 27 illustrate a preferred embodiment of circuits respectively supplying signals Fn and Fp. The first circuit, illustrated in FIG. 26, comprises an N-type transistor Tn and a P-type transistor Tp connected in series between supply voltage Vdd and voltage Vn. Their gates are connected together to form the input of the first circuit, and the point common to transistors Tp and Tn forms the output of the first circuit. In the first circuit, the complement Ec of clock signal E is applied to the input of the first circuit, which then supplies the required signal Fn on output. The second circuit, illustrated in FIG. 27, differs from the first circuit of FIG. 26 by the fact that it receives clock signal E on its input and that transistors Tp and Tn are connected in series between voltage Vp and ground. The second circuit thus supplies the required signal Fp on output.

Figure 28:
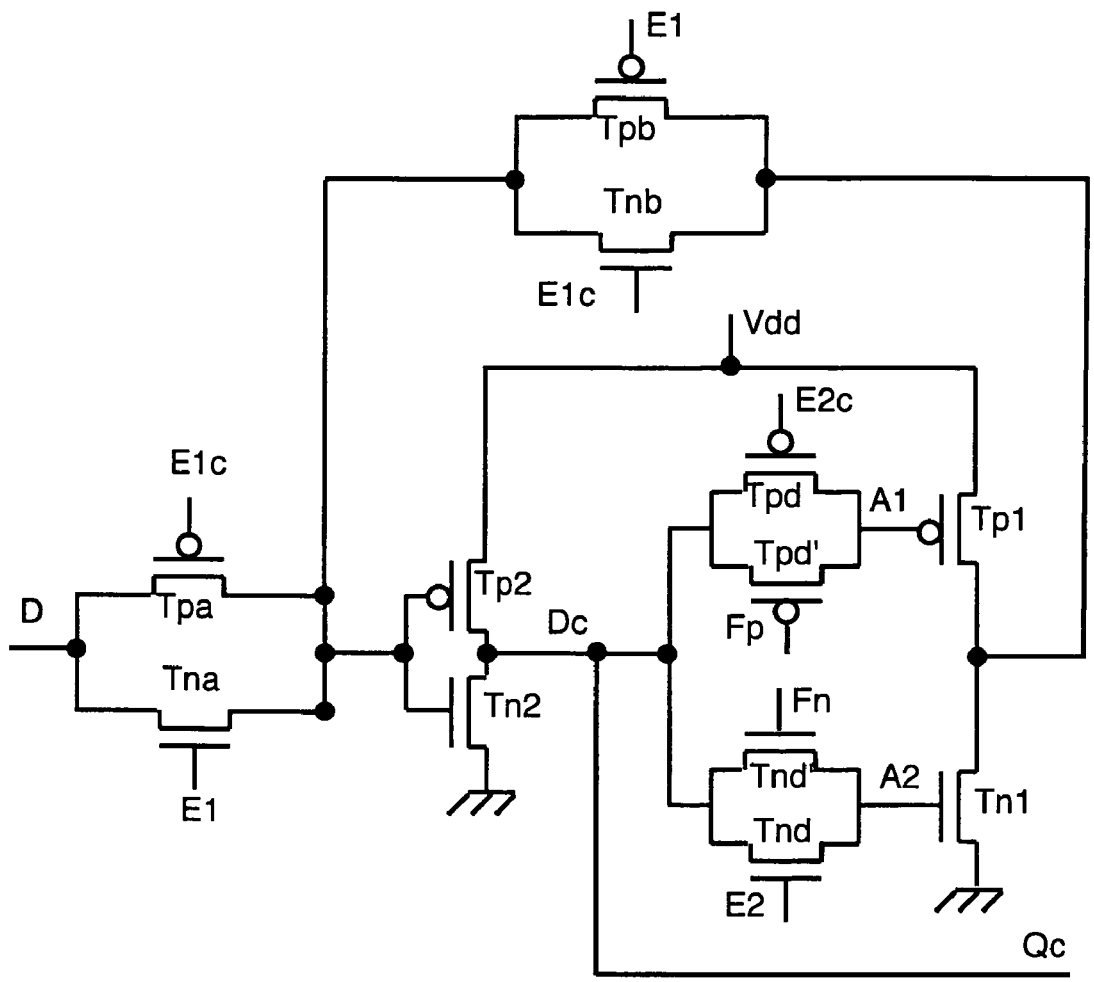

The embodiment illustrated in FIG. 28 constitutes an alternative embodiment of the cell according to FIG. 25. It differs from this figure by the addition of an additional decoupling transistor Tnd' connected in parallel with transistor Tnd and of an additional decoupling transistor Tpd' connected in parallel with transistor Tpd. To increase the leakage currents which recharge inputs A1 and A2, control signals Fn applied to the gate of the additional decoupling transistor Tnd' preferably have a value Vn greater than zero but lower than its threshold voltage VTn, and control signals Fp applied to the gate of additional decoupling transistor Tpd' have a value Vp lower than Vdd, such that Vdd−VTp<Vp<Vdd. In an alternative embodiment, signals Fn and Fp applied to the gates of additional decoupling transistors Tnd' and Tpd' can be complementary refresh signals which periodically turn transistors Tnd' and Tpd' on and restore the values of inputs A1 and A2.

Additional decoupling transistors Tnd' and Tpd', respectively controlled by signals Fn and Fp, can in the same way be respectively added in parallel on decoupling transistors Tnd and Tpd of the other above-described embodiments.

Figure 29:
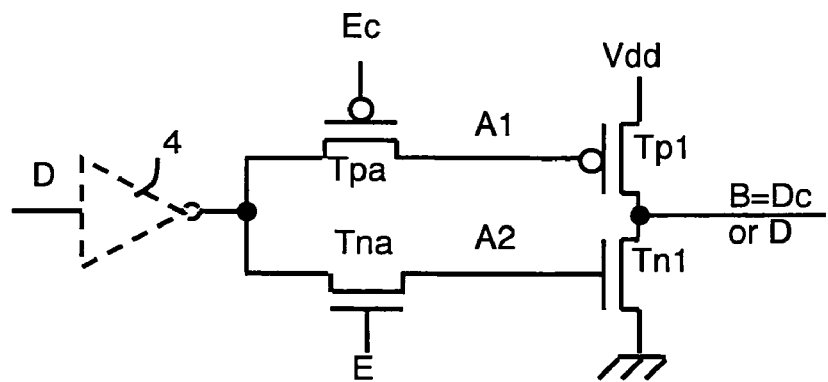
FIG. 29 represents a particular embodiment of a dynamic latch according to the invention.

In certain circuits, the latches are never set to hold state during periods in which they contain useful values. In other words, so long as they contain useful values, they are connected once per clock cycle on input D to receive a new value. In this case, a value is stored in a latch during a very short time interval corresponding to a fraction of the clock period. It is then possible to use a dynamic latch which stores the data in a small capacitance formed by the gate of the transistors of an inverter. According to another object of the invention, a dynamic latch can also be protected against ionizing particles. As illustrated in FIG. 29, this dynamic latch comprises an inverter 1 formed by a transistor Tp1 (PMOS) in series with a transistor Tn1 (NMOS) between Vdd and ground, like the first inverter 1 of the cell according to FIG. 6. Output B of this inverter constitutes the output of the cell. As in FIG. 6, the source of an access transistor Tpa (PMOS) is connected to input D of the cell and its drain to gate A1 of transistor Tp1, whereas an access transistor Tna (NMOS) is connected via its source to input D and via its drain to gate A2 of transistor Tn1 (NMOS). Clock signal E and its complement Ec are respectively applied to the gates of access transistors Tna and Tpa. Output B of the cell takes the value equal to the complement Dc of the value present on input D at the time when clock signal E is equal to 1. As in FIG. 19, an additional input inverter 4 (broken line in FIG. 29) can be connected to input D of the cell to ensure that the signal applied to the sources of access transistors Tpa and Tna is of good quality. In this case, output B of the latch takes the value of input D at the time clock signal E is equal to 1. A disturbance affecting one of the transistors, Tp1 or Tn1, of inverter 1 can modify the value of its output B, but the values of gates A1, A2 of transistors Tp1 and Tn1 of inverter 1 are not affected. Inverter 1 then regenerates the correct value on its output B. If access transistor Tpa is affected, the only possible error is switching from a 0 to a 1. In this case, transistor Tp1 of inverter 1 turns off. Inverter 1 is then in high-impedance state and keeps the correct value of its output B. A similar situation occurs if access transistor Tna is affected. The values stored in the cell are therefore protected against the disturbances induced by ionizing particles.

The invention claimed is:
1. A memory cell protected against transient disturbances, comprising loop-connected first and second inverters, at least the first inverter being formed by a series circuit comprising a P-type transistor and an N-type transistor and having a common point constituting the output of said inverter, wherein the first inverter has two inputs respectively connected by means of decoupling transistors, that are normally turned-off outside write phases, to the output of the second inverter.

2. The cell according to claim 1, wherein the decoupling transistors each have a gate to which low-frequency refresh signals are periodically applied for periodically turning the decoupling transistors on.

3. The cell according to claim 1, wherein the decoupling transistors have sufficient leakage currents to hold the two inputs of the first inverter circuit in the same logic state as the output of the second inverter circuit.

4. The cell according to claim 1, wherein the first and second inverter circuits each comprise a series circuit comprising a P-type transistor and an N-type transistor having a common point respectively constituting the outputs of the first and second inverter circuits, the transistors of the series circuit of the second inverter each having a gate connected to the output of the first inverter circuit, the first decoupling transistor having a source connected to the output of the second inverter circuit and a drain connected to the gate of the P-type transistor of the first inverter circuit, the second decoupling transistor having a source connected to the output of the second inverter circuit and a drain connected to the gate of the P-type transistor of the first inverter circuit.

5. The cell according to claim 4, wherein the first and second decoupling transistors are respectively P-type and N-type transistors.

6. The cell according to claim 4, characterized in wherein the first and second decoupling transistors are N-type transistors.

7. The cell according to claim 6, wherein, in the on state, the current flowing through the N-type transistor of the first inverter circuit is greater than the current flowing through the P-type transistor of the first inverter circuit, in the on state.

8. The cell according to claim 6, wherein the first inverter circuit comprises an additional P-type transistor connected in series between the respectively P-type and N-type transistors of the first inverter circuit and comprising a gate connected to the drain of the second decoupling transistor.

9. The cell according to claim 4, wherein the first and second decoupling transistors are P-type transistors.

10. The cell according to claim 9, wherein, in the on state, the current flowing through the P-type transistor of the first inverter is greater than the current flowing through the N-type transistor of the first inverter circuit, in the on state.

11. The cell according to claim 9, wherein the first inverter circuit comprises an additional N-type transistor connected in series between the respectively P-type and N-type transistors of the first inverter circuit and comprising a gate connected to the drain of the first decoupling transistor.

12. The cell according to claim 1, comprising first and second access transistors respectively connected between an input of the cell and the inputs of the first inverter.

13. The cell according to claim 1, comprising at least one access transistor connected between an input of the cell and the output of the second inverter.

14. The cell according to claim 1, comprising at least one access transistor connected between an input of the cell and the input of the second inverter, the output of the second inverter constituting the output of the cell, disconnecting transistors of complementary type being connected in parallel between the output of the first inverter and the input of the second inverter, the disconnecting transistors being controlled such as to be turned off during the write phases and turned on outside the write phases.

15. The cell according to claim 12, wherein an access control signal is applied to the gate of the N-type access transistors and a complementary access control signal is applied to the gate of the P-type access transistors.

16. The cell according to claim 13, wherein an access control signal is applied to the gate of the N-type access transistors and decoupling transistors and a complementary access control signal is applied to the gate of the P-type access transistors and decoupling transistors.

17. The cell according to claim 12, comprising a clock circuit comprising two distinct sub-branches respectively supplying first and second clock signals respectively applied to the access transistors and to the decoupling transistors from a common clock signal.

18. The cell according to claim 12, wherein the decoupling transistors are arranged on the shortest path between the input of the cell and the inputs of the first inverter.

19. The cell according to claim 1, comprising an access circuit formed by a three-state gate connected between an input of the cell and the output of the second inverter.

20. The cell according to claim 19, wherein the three-state gate is controlled by first and second access control signals respectively applied to the gates of the first and second decoupling transistors.

21. The cell according to claim 1, comprising an additional decoupling transistor connected in parallel with a decoupling transistor.

22. A memory cell of the master-slave type, comprising a master cell formed by a cell according to claim 1 and a slave cell formed by a cell according to claim 1.

23. The cell according to claim 1, comprising at least one P-type decoupling transistor having a gate connected to a positive supply voltage.

24. The cell according to claim 1, comprising at least one N-type decoupling transistor having a gate connected to the ground.

25. The cell according to claim 1, comprising at least one P-type decoupling transistor having a gate connected to a voltage comprised between a positive supply voltage and the difference between said supply voltage and the threshold voltage of said P-type decoupling transistor.

26. The cell according to claim 1, comprising at least one N-type decoupling transistor having a gate connected to a voltage Vn comprised between 0 and the threshold voltage of said N-type decoupling transistor.

27. The cell according to claim 1, wherein the second inverter is formed by a three-state gate.

28. The cell according to claim 13, comprising an additional N-type access transistor connected in parallel with a P-type access transistor to one of the inputs of the first inverter, formed by the gate of a P-type transistor.

* * * * *